United States Patent
Tsuda et al.

(10) Patent No.: US 10,141,544 B2
(45) Date of Patent: Nov. 27, 2018

(54) ELECTROLUMINESCENT DISPLAY DEVICE AND MANUFACTURING METHOD THEREOF

(71) Applicant: Semiconductor Energy Laboratory Co., Ltd., Atsugi-shi, Kanagawa-ken (JP)

(72) Inventors: Kazuki Tsuda, Atsugi (JP); Kohei Yokoyama, Fujisawa (JP); Yasuhiro Jinbo, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/670,318

(22) Filed: Aug. 7, 2017

(65) Prior Publication Data

US 2018/0047946 A1 Feb. 15, 2018

(30) Foreign Application Priority Data

Aug. 10, 2016 (JP) .................................. 2016-157108
Jan. 13, 2017 (JP) .................................. 2017-003831

(51) Int. Cl.
*H01L 51/56* (2006.01)
*G02F 1/1368* (2006.01)
*H01L 27/12* (2006.01)
*H01L 51/52* (2006.01)
(Continued)

(52) U.S. Cl.
CPC ............ *H01L 51/56* (2013.01); *G02F 1/1368* (2013.01); *H01L 27/1214* (2013.01); *H01L 51/5253* (2013.01); *H01L 27/322* (2013.01); *H01L 27/3232* (2013.01); *H01L 29/66007* (2013.01)

(58) Field of Classification Search
CPC ................. H01L 51/56; H01L 27/1214; H01L 29/66007; H01L 51/5253; G02F 1/1358
See application file for complete search history.

(56) References Cited

U.S. PATENT DOCUMENTS

| 6,219,127 B1 | 4/2001 | Hirakata et al. |
| 6,580,094 B1 | 6/2003 | Yamazaki et al. |
| 6,864,943 B2 | 3/2005 | Hirakata et al. |

(Continued)

FOREIGN PATENT DOCUMENTS

| JP | 10-172757 A | 6/1998 |
| JP | 2003-174153 A | 6/2003 |

(Continued)

*Primary Examiner* — William Coleman
(74) *Attorney, Agent, or Firm* — Robinson Intellectual Property Law Office; Eric J. Robinson

(57) ABSTRACT

A highly reliable display device or electronic device is provided. The display device includes a first electrode, a second electrode, a light-emitting layer between the first electrode and the second electrode, and a protective film over the second electrode. The protective film includes a first insulating film and a second insulating film over the first insulating film. The first insulating film includes one or more of aluminum oxide, hafnium oxide, and zirconium oxide, and the second insulating film includes one or more of aluminum oxide, hafnium oxide, and zirconium oxide. A composition of the first insulating film is different from a composition of the second insulating film. A water vapor transmission rate of the protective film is lower than $1\times10^{-2}$ g/(m²·day).

16 Claims, 26 Drawing Sheets

(51) Int. Cl.
   *H01L 29/66* (2006.01)
   *H01L 27/32* (2006.01)

(56) References Cited

U.S. PATENT DOCUMENTS

| | | | |
|---|---|---|---|
| 7,283,185 B2 | 10/2007 | Hirakata et al. | |
| 8,003,999 B2 * | 8/2011 | Cho | H01L 51/5256 257/98 |
| 8,415,208 B2 | 4/2013 | Takayama et al. | |
| 9,054,204 B2 * | 6/2015 | Oshima | H01L 29/78693 |
| 9,166,192 B2 | 10/2015 | Yamazaki et al. | |
| 2007/0072439 A1 | 3/2007 | Akimoto et al. | |
| 2007/0108446 A1 | 5/2007 | Akimoto | |
| 2011/0012112 A1 | 1/2011 | Yamazaki et al. | |
| 2012/0061718 A1 | 3/2012 | Yamazaki et al. | |
| 2012/0126234 A1 | 5/2012 | Yamazaki et al. | |
| 2012/0300151 A1 | 11/2012 | Yamazaki et al. | |
| 2013/0001582 A1 | 1/2013 | Kadono et al. | |
| 2013/0048967 A1 | 2/2013 | Nishido et al. | |
| 2016/0120054 A1 | 4/2016 | Yamazaki et al. | |
| 2016/0147109 A1 | 5/2016 | Yamazaki et al. | |
| 2016/0154268 A1 | 6/2016 | Yamazaki et al. | |
| 2016/0155984 A1 | 6/2016 | Yamazaki et al. | |
| 2016/0190055 A1 | 6/2016 | Jinbo et al. | |
| 2016/0356927 A1 * | 12/2016 | Yasui | G02B 5/3033 |
| 2017/0040570 A1 * | 2/2017 | Kim | H01L 51/44 |

FOREIGN PATENT DOCUMENTS

| | | |
|---|---|---|
| JP | 2007-123861 A | 5/2007 |
| JP | 2007-165861 A | 6/2007 |
| JP | 2011-018479 A | 1/2011 |
| JP | 2011-044699 A | 3/2011 |

* cited by examiner

ELECTROLUMINESCENT DISPLAY DEVICE AND MANUFACTURING METHOD THEREOF

BACKGROUND OF THE INVENTION

1. Field of the Invention

One embodiment of the present invention relates to a display device. One embodiment of the present invention relates to a method for manufacturing a display device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. One embodiment of the present invention relates to a memory device, a processor, a driving method thereof, or a manufacturing method thereof.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like may include a semiconductor device.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the light-emitting elements can have flexibility; therefore, the use of a flexible substrate for the display device has been proposed.

As a method for manufacturing a display device including a flexible substrate, a technique has been developed in which a semiconductor element such as a thin film transistor is manufactured over a substrate such as a glass substrate or a quartz substrate, for example, a space between the semiconductor element and another substrate (e.g., a flexible substrate) is filled with an organic resin, and then the semiconductor element is transferred from the glass substrate or the quartz substrate to the other substrate (Patent Document 1).

In some cases, over a light-emitting element that has been formed over a flexible substrate, another flexible substrate is provided in order to protect a surface of the light-emitting element or prevent entry of moisture or impurities from the outside.

Display devices are expected to be applied to a variety of uses and become diversified. For example, a smartphone and a tablet with a touch sensor are being developed as portable information terminals.

REFERENCE

Patent Document

[Patent Document 1] Japanese Published Patent Application No. 2003-174153

SUMMARY OF THE INVENTION

In particular, a light-emitting element that contains an organic compound as its main component easily deteriorates mainly because of water. This might result in a partial decrease in the luminance of a display device. A non-light-emitting region might be formed in the display device.

An object of one embodiment of the present invention is to provide a highly reliable display device or electronic device. Another object of one embodiment of the present invention is to provide a display device or an electronic device that does not break easily. Another object of one embodiment of the present invention is to provide a display device or an electronic device that is thin or lightweight. Another object of one embodiment of the present invention is to provide a low-power-consumption display device or electronic device. Another object of one embodiment of the present invention is to provide a novel display device or electronic device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a display device which includes a first electrode, a second electrode, a light-emitting layer between the first electrode and the second electrode, and a protective film over the second electrode. In the display device, the protective film includes a first insulating film and a second insulating film over the first insulating film. The first insulating film includes one or more of aluminum oxide, hafnium oxide, and zirconium oxide, and the second insulating film includes one or more of aluminum oxide, hafnium oxide, and zirconium oxide. A composition of the first insulating film is different from a composition of the second insulating film. A water vapor transmission rate of the protective film is lower than $1\times10^{-2}$ g/(m$^2$·day).

One embodiment of the present invention is a display device which includes a first electrode, a third insulating film overlapping with an edge portion of the first electrode, a light-emitting layer over the first electrode and the third insulating film, a second electrode over the light-emitting layer, and a protective film over the second electrode. In the display device, the protective film includes a first insulating film and a second insulating film over the first insulating film. The first insulating film includes one or more of aluminum oxide, hafnium oxide, and zirconium oxide, and the second insulating film includes one or more of aluminum oxide, hafnium oxide, and zirconium oxide. The first insulating film includes a first region overlapping with the first electrode with the light-emitting layer positioned therebetween and a second region overlapping with the third insulating film with the light-emitting layer positioned therebetween. The second region includes a region having a lower film density than the first region.

One embodiment of the present invention is a method for manufacturing a display device, which includes the steps of: forming a light-emitting element including a first electrode, a second electrode, and a light-emitting layer between the first electrode and the second electrode; forming a first insulating film including one or more of aluminum oxide, hafnium oxide, and zirconium oxide over the light-emitting element by a sputtering method; and forming the second insulating film including one or more of aluminum oxide, hafnium oxide, and zirconium oxide over the first insulating film by an atomic layer deposition method.

Note that the second insulating film may have a higher carbon content than the first insulating film.

Furthermore, part of the second insulating film may fill part of the first insulating film.

Furthermore, a color film which is in contact with the second insulating film may be included.

In the above embodiments of the present invention, a first display element and a second display element may be included. The first display element may be a light-emitting element including the first electrode, the second electrode, and the light-emitting layer between the first electrode and the second electrode. The second display element may be a liquid crystal element.

One embodiment of the present invention can provide a highly reliable display device or electronic device. One embodiment of the present invention can provide a display device, an electronic device, or the like that does not break easily. One embodiment of the present invention can provide a display device, an electronic device, or the like that is thin or lightweight. One embodiment of the present invention can provide a low-power-consumption display device or electronic device or the like. One embodiment of the present invention can provide a novel display device or electronic device or the like.

Note that the descriptions of these effects do not disturb the existence of other effects. One embodiment of the present invention need not have all of these effects. Other effects will be apparent from and can be derived from the description of the specification, the drawings, the claims, and the like.

BRIEF DESCRIPTION OF THE DRAWINGS

In the accompanying drawings:

FIGS. 11A, 11B1, and 11B2 are a view illustrating a circuit of a display device and top views of pixels;

DETAILED DESCRIPTION OF THE INVENTION

Figure 1A:
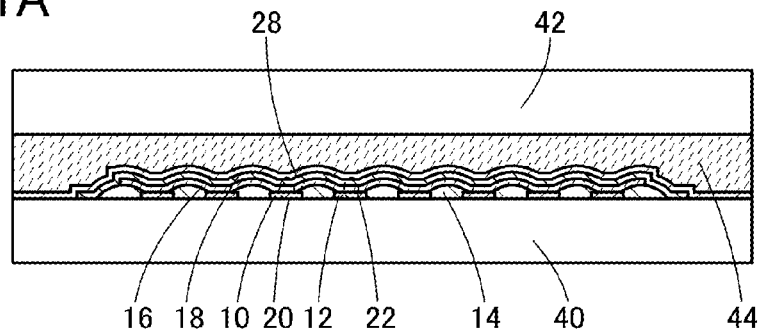
FIGS. 1A to 1C illustrate a display device according to one embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can cause amplification of current or voltage, switching operation for controlling conduction and non-conduction, or the like. A transistor in this specification includes an insulated-gate field effect transistor (IGFET) and a thin film transistor (TFT).

In this specification and the like, a metal oxide means an oxide of metal in a broad sense. A metal oxide is classified into an oxide insulator, an oxide conductor (including a transparent oxide conductor), an oxide semiconductor (also simply referred to as an OS), and the like. For example, a metal oxide used in a semiconductor film of a transistor is called an oxide semiconductor in some cases. In other words, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. Note that CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor film of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

Embodiment 1

In this embodiment, an example of a display device is described with reference to FIGS. 1A to 1C and FIGS. 2A and 2B.

FIG. 1A is a schematic cross-sectional view of a display device according to this embodiment. A light-emitting element 20 and a light-emitting element 22 are positioned between a substrate 40 and a substrate 42. The light-emitting element 20 includes a first electrode 10, an EL layer 16, and a second electrode 18. The light-emitting element 22 includes a first electrode 12, the EL layer 16, and the second electrode 18. An insulating film 14 covering edge portions of the first electrodes 10 and 12 is formed. A protective film 28 is provided over the light-emitting element 20. The protective film 28 and the substrate 42 are fixed to each other with an adhesive 44. Note that the substrates 40 and 42, the adhesive 44, the first electrodes 10 and 12, the EL layer 16, the second electrode 18, and the insulating film 14 are described in detail in another embodiment.

Next, the vicinity of the light-emitting elements 20 and 22 is described with reference to an enlarged cross-sectional view illustrated in FIG. 1B. The light-emitting element 20 includes the first electrode 10, the EL layer 16 including a light-emitting layer, and the second electrode 18. The light-emitting element 22 includes the first electrode 12, the EL layer 16, and the second electrode 18. The first electrode 10 and the first electrode 12 are separated from each other. The insulating film 14 covering the edge portions of the first electrodes 10 and 12 is formed. In other words, part of a surface of each of the first electrodes 10 and 12 is exposed at openings of the insulating film 14. Over the light-emitting elements 20 and 22, the protective film 28 including an insulating film 24 and an insulating film 26 over the insulating film 24 is formed.

Each of the insulating films 24 and 26 can be formed of a single layer or a multilayer of an oxide such as aluminum oxide, gallium oxide, germanium oxide, yttrium oxide, zirconium oxide, lanthanum oxide, neodymium oxide, hafnium oxide, or tantalum oxide. Furthermore, the insulating films 24 and 26 can each be formed using a nitride such as silicon nitride or aluminum nitride.

Note that the insulating films 24 and 26 may be formed using the same oxide or nitride. Alternatively, the insulating films 24 and 26 may be formed using different oxides or nitrides. For example, the insulating films 24 and 26 can be formed using aluminum oxide. Alternatively, the insulating films 24 and 26 can be formed using zirconium oxide. Further alternatively, the insulating films 24 and 26 can be formed using aluminum oxide and silicon nitride, respectively. Still further alternatively, the insulating films 24 and 26 can be formed using zirconium oxide and silicon nitride, respectively.

The thickness of the insulating film 24 can be more than or equal to 50 nm and less than or equal to 1000 nm, preferably more than or equal to 100 nm and less than or equal to 300 nm. Furthermore, the thickness of the insulating film 26 can be more than or equal to 1 nm and less than or equal to 100 nm, preferably more than or equal to 5 nm and less than or equal to 50 nm.

Figure 1B:
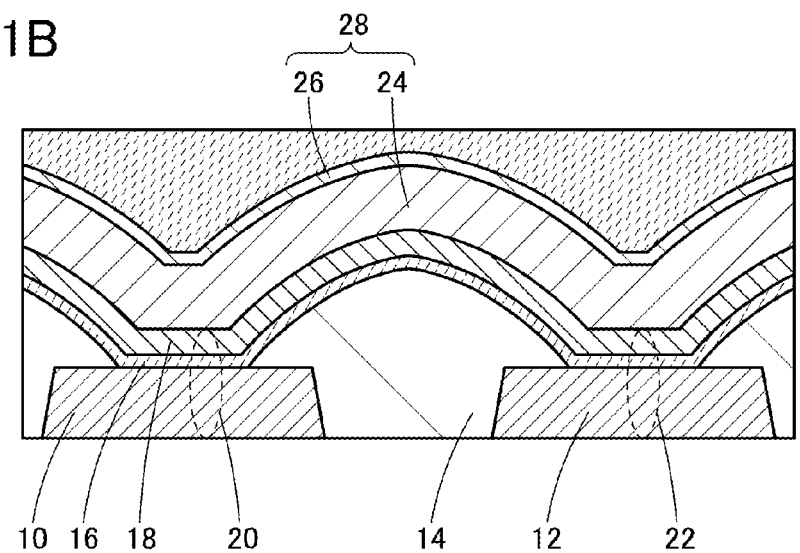
Figure 1C:
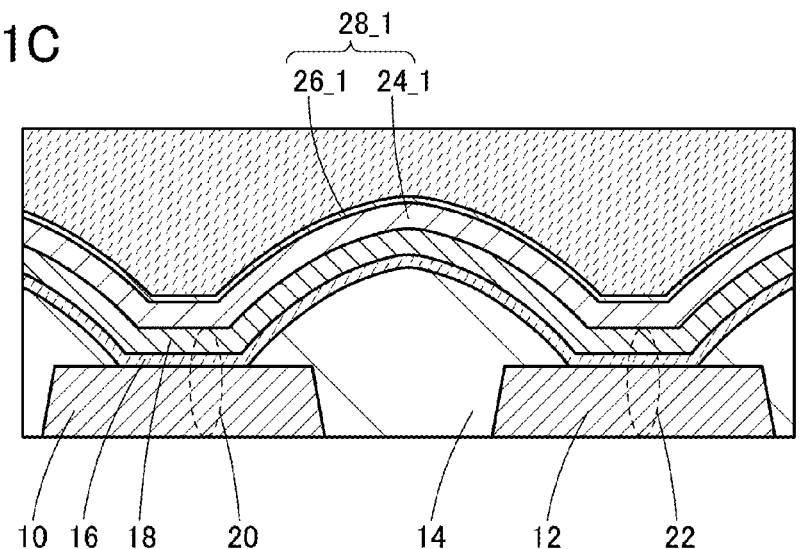

Note that when an insulating film 24_1 formed over the second electrode 18 and an insulating film 26_1 over the insulating film 24_1 each have a small thickness as in a protective film 28_1 illustrated in FIG. 1C, throughput is improved, so that the productivity of the display device can be increased.

The insulating films 24 and 24_1 are formed by a sputtering method. The insulating films 26 and 26_1 are formed by an atomic layer deposition (ALD) method.

In an ALD method, a film is deposited by setting the pressure in a deposition chamber to an atmospheric pressure or a reduced pressure, sequentially introducing source gases for reaction (e.g., an oxidizer and a precursor) into the deposition chamber, and repeatedly introducing the source gases. A first source gas is adsorbed onto a surface to form a first layer, and then a second source gas is introduced into the deposition chamber, which causes a reaction between the first layer and the second source gas, so that a second layer is stacked over the first layer; thus, a thin film is formed. The sequence of the source gas introduction is repeated a plurality of times until a desired thickness is obtained, whereby a thin film with excellent step coverage can be formed.

Note that as the ALD method, there are a thermal ALD method which utilizes thermal reaction as means for activating part or the whole of the source gases, and a plasma enhanced ALD (PEALD) method or a plasma-assisted ALD (PAALD) method each of which utilizes plasma reaction. The film formation temperature of the PEALD method can be lower than that of the thermal ALD method. In the PEALD method, a film can be deposited at about room temperature. Furthermore, effects of the PEALD method are an increase of the film deposition rate and formation of a dense film, for example.

By stacking insulating films using different film deposition methods, a protective film capable of reducing diffusion of impurities, such as water or oxygen, can be formed. A sputtering method and an ALD method are capable of depositing a film at a low temperature. An EL layer included in a light-emitting element has low heat resistance. Therefore, the insulating films 24 and 24_1 and the insulating films 26 and 26_1 functioning as protective films are preferably formed at a relatively low temperature, typically a temperature of lower than or equal to 100° C., and a sputtering method and an ALD method are suitable.

In the case where the insulating films 24 and 24_1 and the insulating films 26 and 26_1 are aluminum oxide films, the film densities of the insulating films 24 and 24_1 and the insulating films 26 and 26_1 are each preferably higher than or equal to 2.5 g/cm$^3$ and lower than 3.95 g/cm$^3$. Note that the film density can be measured by X-ray reflectometry (XRR).

The insulating films 24 and 24_1 include a smaller amount of impurities such as carbon than the insulating films 26 and 26_1. In other words, the insulating films 26 and 26_1 include a larger amount of impurities such as carbon than the insulating films 24 and 24_1. Note that impurities can be quantified by X-ray photoelectron spectroscopy (XPS).

When the film deposition temperature of the ALD method is low, part of the precursor does not react and remains as impurities. In contrast, in the sputtering method, part of a target is physically deposited to form a film; thus, impurities are unlikely to enter the film.

For the above-described reasons, since the insulating films 24 and 24_1 are formed by a sputtering method and the insulating films 26 and 26_1 are formed by an ALD method, the insulating films 24 and 24_1 include a smaller amount of impurities than the insulating films 26 and 26_1.

The water vapor transmission rate of the protective films 28 and 28_1 is lower than $1\times10^{-2}$ g/(m$^2$·day), preferably lower than or equal to $5\times10^{-3}$ g/(m$^2$·day), further preferably lower than or equal to $1\times10^{-4}$ g/(m$^2$·day), still further preferably lower than or equal to $1\times10^{-5}$ g/(m$^2$·day), yet further preferably lower than or equal to $1\times10^{-6}$ g/(m$^2$·day). When the water vapor transmission rate is low, the protective films 28 and 28_1 function as moisture-proof films. As a result, water diffusion from the outside to the light-emitting elements can be reduced.

Although the protective film 28 has a stacked structure of the insulating film 24 and the insulating film 26 in FIG. 1B, a plurality of pairs of the insulating film 24 and the insulating film 26 may be stacked as well. For example, the insulating film 24, the insulating film 26, the insulating film 24, and the insulating film 26 may be stacked in this order.

Figure 2A:
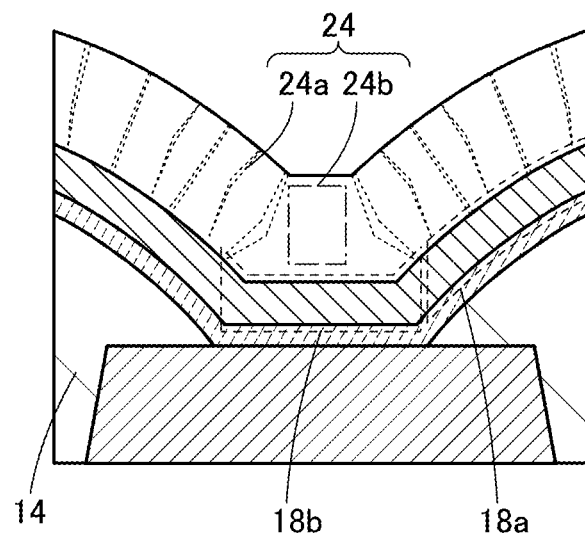
FIGS. 2A and 2B illustrate a display device according to one embodiment.

Here, the protective film 28 of one embodiment of the present invention and a manufacturing method thereof are described. FIG. 2A is an enlarged cross-sectional view of the insulating film 24 formed by a sputtering method. The insulating film 24 is formed by a sputtering method in the following manner: a sputtering target is sputtered with a sputtering gas so that a component of the sputtering target is deposited on a formation surface. Thus, the deposited film includes a small amount of impurities.

However, in the sputtering method, because a component of the sputtering target is physically deposited on a formation surface, the deposited film is susceptible to the shape of the surface. The second electrode 18 having a surface on which the insulating film 24 is formed includes a region 18a overlapping with the insulating film 14 and a region 18b not overlapping with the insulating film 14. A surface of the region 18a, which overlaps with the insulating film 14, is oblique to the substrate. In contrast, a surface of the region 18b, which does not overlap with the insulating film 14, is parallel to the substrate. Accordingly, in the insulating film 24, a low-density region 24a is likely to be formed over the region 18a. In contrast, a region 24b formed over the region 18b of the insulating film 24 hardly includes the low-density region 24a.

Water, oxygen, and the like are easily diffused into the low-density region 24a. Therefore, it is difficult to prevent the diffusion of water, oxygen, and the like from the outside to the light-emitting element only with a single-layer protective film of the insulating film 24 formed by a sputtering method.

Figure 2B:
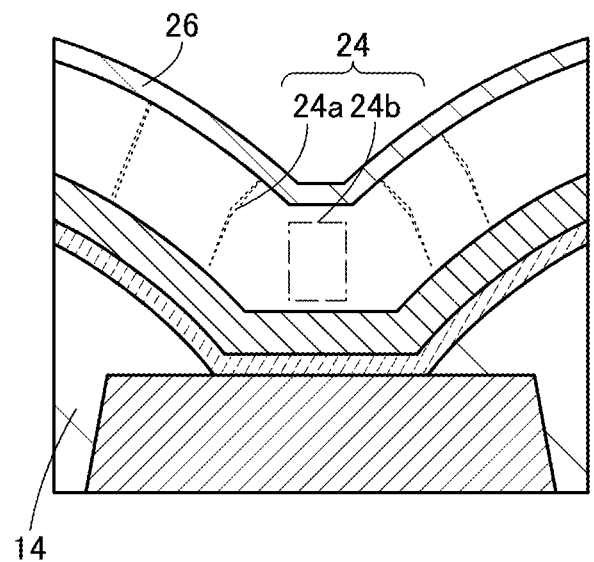

By forming the insulating film 26 over the insulating film 24 using an ALD method, the proportion of the low-density region 24a in the insulating film 24 can be decreased as illustrated in FIG. 2B. This is because the ALD method is a single atomic layer deposition method with high coverage in which the insulating film 26 is deposited while filling spaces of the low-density region 24a of the insulating film 24 formed by a sputtering method. Furthermore, even when the low-density region 24a is included in the insulating film 24, the insulating film 26 is formed to cover the low-density region 24a. Thus, the insulating film 26 functions as a protective film against diffusion of impurities and can prevent diffusion of water, oxygen, and the like from the outside to the light-emitting element.

From the above, formation of an insulating film by an ALD method following the formation of an insulating film over a light-emitting element by a sputtering method enables formation of a protective film in which diffusion of water, oxygen, and the like is reduced. The protective film formed over the light-emitting element can prevent diffusion of water, oxygen, and the like from the outside to the light-emitting element as well as suppressing degradation of the light-emitting element. Moreover, a display device including a highly reliable light-emitting element can be manufactured.

Embodiment 2

Figure 3A:
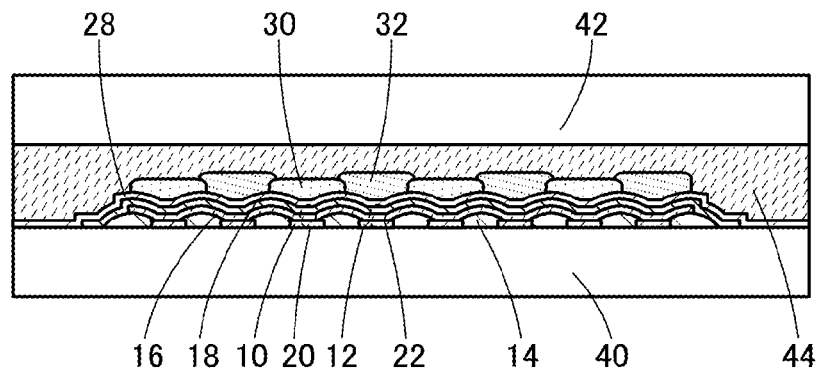
FIGS. 3A and 3B illustrate a display device according to one embodiment.
Figure 3B:
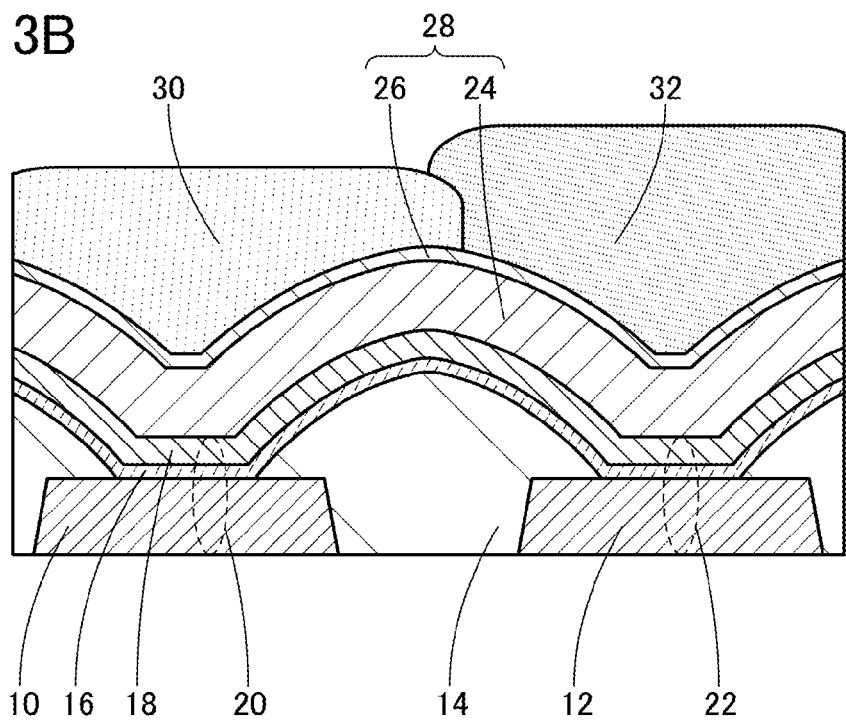

In this embodiment, another structure of a display device is described with reference to FIGS. 3A and 3B. FIG. 3A is a schematic cross-sectional view of a display device according to this embodiment. The display device illustrated in FIGS. 3A and 3B is characterized by including a color film 30 and a color film 32 between the protective film 28 and the adhesive 44.

The vicinity of the light-emitting elements 20 and 22 is described with reference to an enlarged cross-sectional view illustrated in FIG. 3B. The color films 30 and 32 are provided over the protective film 28. The color film 30 overlaps with the light-emitting element 20 with the protective film 28 interposed therebetween. The color film 32 overlaps with the light-emitting element 22 with the protective film 28 interposed therebetween.

The details of the color films 30 and 32 will be described later in another embodiment.

The color films 30 and 32 can be formed by applying a composition onto the protective film 28 and performing a photolithography process in which light exposure, development, and then heat treatment are performed. Alternatively, the color films 30 and 32 can be formed by discharging a composition by an ink-jet method and then performing heat treatment.

The color films 30 and 32 are formed using a composition. In the case where water or the like is contained in the composition and diffused into the light-emitting elements, the light-emitting elements deteriorate.

However, the protective film 28 can suppress the diffusion of water, oxygen, and the like from the outside. Thus, even when color films are directly formed over the protective film 28, water or the like contained in the material of the color films is unlikely to be diffused into the light-emitting elements, so that deterioration of the light-emitting elements can be suppressed.

In the display device, because the color films are formed over the light-emitting elements, the thickness of the display device can be small. In particular, in display devices with a high resolution of 1000 ppi or more, in the case where a counter substrate is provided with color films or the like, the positional alignment between the light-emitting elements and the color films is necessary. As the resolution of the display device becomes higher, the positional alignment between the light-emitting elements and the color films becomes more difficult, lowering the yield. Forming the color films over the light-emitting elements eliminates the need for positional alignment between the light-emitting elements and the color films and can thus increase the yield.

In a high-resolution display device, when the distance between the light-emitting elements and the color films is large, light leaks to a color film of an adjacent pixel, which adversely influences the viewing angle characteristics. In order to increase the viewing angle characteristics, the distance between the light-emitting elements and the color films is preferably small. Since the color films can be formed over the light-emitting elements with the protective film interposed therebetween, the distance between the light-emitting elements and the color films in the display device of this embodiment can be small and the viewing angle characteristics can be improved.

Embodiment 3

In this embodiment, an example of the display device of one embodiment of the present invention will be described.

A more specific structure example of the display device of one embodiment of the present invention is described below with reference to drawings.

<Display Device>

Figure 4:
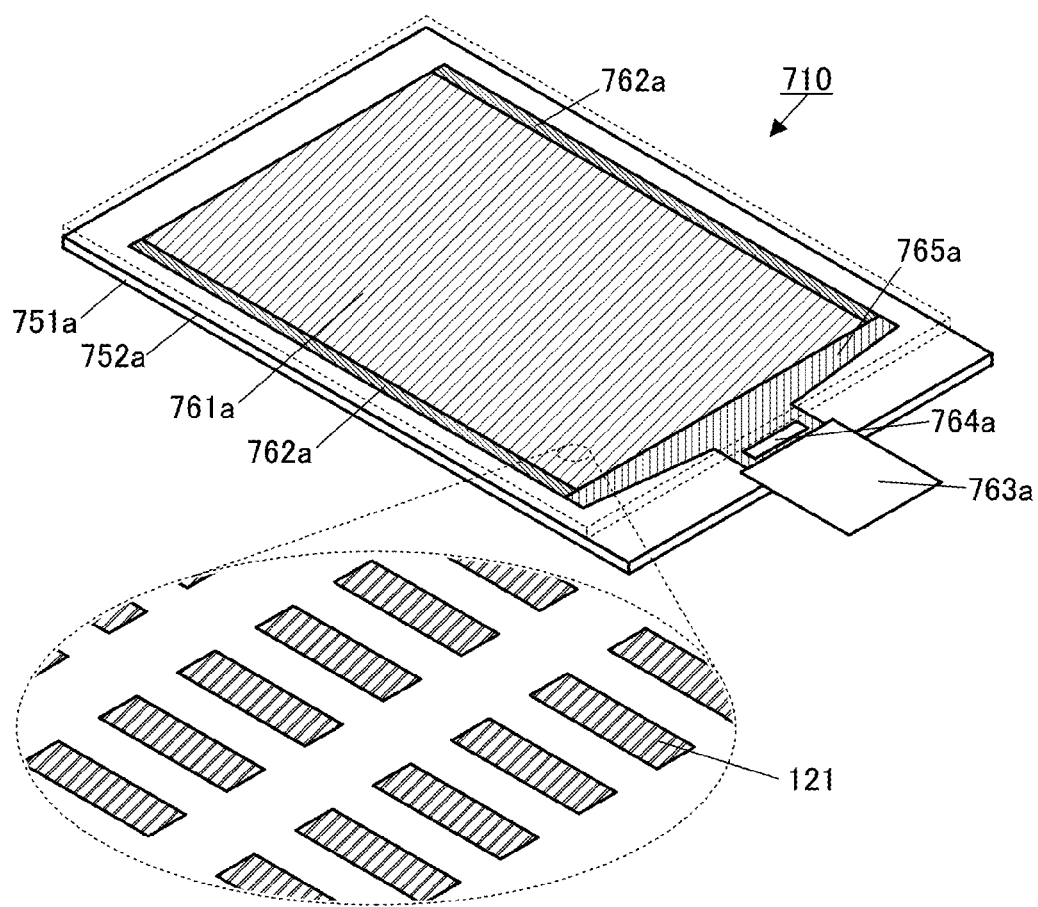
FIG. 4 illustrates a display device according to one embodiment.

FIG. 4 is a perspective view of a display device 710.

The display device 710 includes a substrate 751a and a substrate 752a. In FIG. 4, the outline of the substrate 752a is illustrated by dashed lines.

The display device 710 includes a display portion 761a, a circuit portion 762a, a wiring 765a, and the like between the substrates 751a and 752a. An IC 764a and an FPC 763a are mounted on the substrate 751a. Therefore, the display device 710 can also be referred to as a display module.

In the circuit portion 762a, a circuit functioning as a scan line driver circuit can be used, for example.

The wiring 765a has a function of supplying a signal and electric power to the display portion 761a or the circuit portion 762a. The signal and electric power are input from outside through the FPC 763a or from the IC 764a.

In the example of FIG. 4, the IC 764a is mounted on the substrate 751a by a chip on glass (COG) method or the like. As the IC 764a, an IC serving as a scan line driver circuit, a signal line driver circuit, or the like can be used, for example. Note that the IC 764a is not necessarily provided if not needed. The IC 764a may be mounted on the FPC 763a by a chip on film (COP) method or the like.

FIG. 4 illustrates an enlarged view of part of the display portion 761a. Conductive films 121 included in a plurality of display elements are arranged in a matrix in the display portion 761a.

Figure 5A:
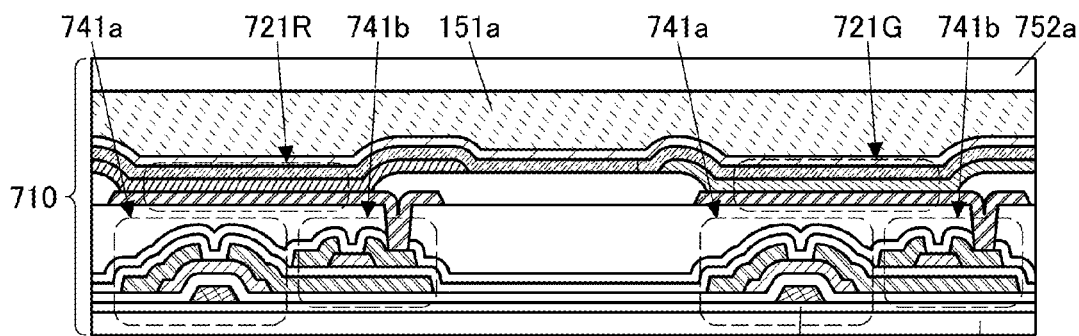
FIGS. 5A to 5C illustrate a display device according to one embodiment.

FIG. 5A is a schematic cross-sectional view of a display portion of the display device 710.

The display device 710 includes a transistor 741a, a transistor 741b, a display element 721R, a display element 721G, a display element 721B (not shown), and the like between the substrate 751a and the substrate 752a. The substrate 751a and the substrate 752a are bonded to each other with an adhesive layer 151a. The transistor 741a, the transistor 741b, the display element 721R, and the like are provided over an insulating film 731.

The display element 721R, the display element 721G, and the display element 721B (not shown) which are included in the display device 710 include light-emitting elements showing different colors and emit light to the substrate 752a side (the display surface side).

Figure 5B:
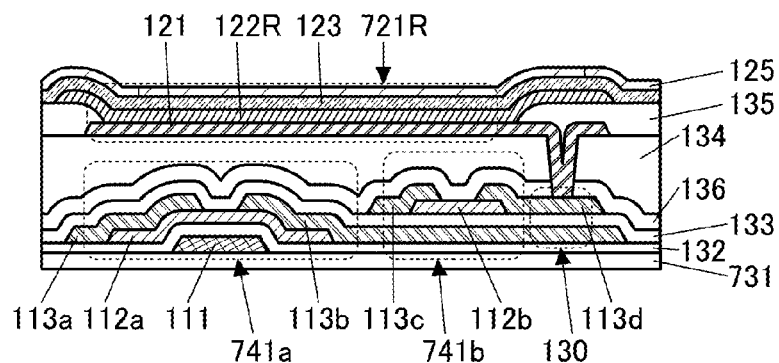

FIG. 5B is an enlarged view of the transistor 741a and the transistor 741b, the display element 721R, and the vicinity thereof in FIG. 5A. Note that the display element 721B or the like can have the structure similar to that of the display element 721R or the like; thus, the description is skipped and description below is referred to.

The transistor 741a and the transistor 741b are provided over the insulating film 731. The transistor 741a is connected to the transistor 741b and serves as a pixel-selection transistor. The transistor 741b is connected to the display element 721R and serves as a driver transistor for controlling current flowing to the display element 721R.

The transistor 741a includes a conductive film 111 serving as a gate, an insulating film 132 serving as a gate insulating film, a semiconductor film 112a, a conductive film 113a serving as one of a source and a drain, and a conductive film 113b serving as the other of the source and the drain. The transistor 741a illustrated in FIG. 5B and the like is a channel-etched bottom-gate transistor.

An insulating film 133 is provided to cover the transistor 741a. The insulating film 133 serves as a protective film for protecting the transistor 741a.

The transistor 741b includes a semiconductor film 112b over the conductive film 113b with the insulating film 133 sandwiched therebetween. The transistor 741b also includes a conductive film 113c and a conductive film 113d in contact with the semiconductor film 112b. Part of the conductive film 113b serves as a gate of the transistor 741b. Part of the insulating film 133 serves as a gate insulating film of the transistor 741b. The conductive film 113c and the conductive film 113d serve as the source and the drain of the transistor 741b.

As described above, the transistor 741b is provided above the transistor 741a. The conductive film 113b serves as both the other of the source and the drain of the transistor 741a and the gate of the transistor 741a. The area occupied by the transistors 741a and 741b can be reduced in this structure as compared with a structure in which they are provided side by side on the same plane.

Part of the conductive film 113d, part of the insulating film 133, and part of the conductive film 113b are stacked to form a capacitor 130. The capacitor 130 functions as a storage capacitor of the pixel.

An insulating film 136 and an insulating film 134 cover the transistor 741b. The insulating film 136 serves as a protective film for protecting the transistor 741b. The insulating film 134 preferably serves as a planarization film. Note that either one of the insulating film 136 and the insulating film 134 is not necessarily provided if not needed.

The conductive film 121 is provided over the insulating film 134. The conductive film 121 is electrically connected to the conductive film 113d through an opening provided in the insulating films 134 and 136. In addition, an insulating film 135 covers an edge portion of the conductive film 121 and the opening. An EL layer 122R and a conductive film 123 are stacked over the insulating film 135 and the conductive film 121. A protective film 125 is provided over the conductive film 123. By using the protective film described in Embodiment 1 as the protective film 125, deterioration of the display elements 721R, 721G, and 721B can be suppressed.

The conductive film 121 serves as a pixel electrode of the display element 721R. The conductive film 123 serves as a common electrode. The EL layer 122R includes at least a light-emitting layer.

The display element 721R is a top-emission light-emitting element which emits light to the side opposite to the formation surface side. A conductive film that reflects visible light can be used as the conductive film 121. A conductive film that transmits visible light can be used as the conductive film 123.

FIGS. 5A and 5B show an example in which EL layers are formed separately for display elements showing different colors. The EL layers of the display elements include light-emitting layers showing different colors.

The EL layer 122R included in the display element 721R includes a light-emitting layer emitting red color, for example. When the EL layers are formed separately for display elements showing different colors like this, the color purity of light emitted from the display elements can be increased. In addition, light extraction efficiency can be increased as compared with the case where a color film (color filter) or the like is used. Furthermore, driving voltage can be reduced as compared with the case where, for example, a light-emitting element emitting white light which is formed by stacking a plurality of light-emitting layers is used.

Here, the structure of a light-emitting element which can be used for the display element 721R, the display element 721G, the display element 721B, and the like is described.

Figure 6A:
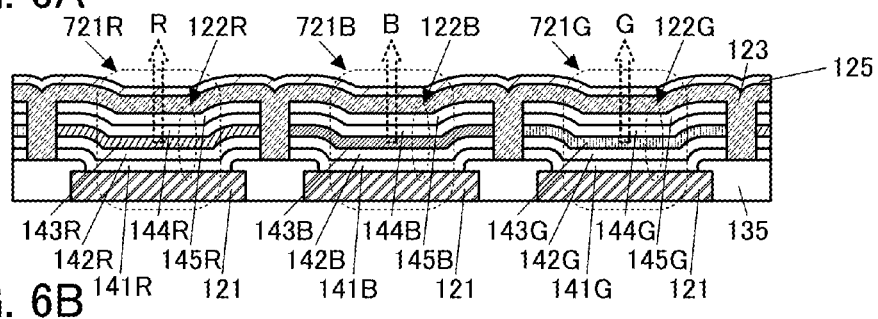
FIGS. 6A to 6E each illustrate a display device according to one embodiment.

FIG. 6A shows an example in which all layers forming the EL layers are formed separately for display elements showing different colors.

The display element 721R includes the EL layer 122R between the conductive film 121 and the conductive film 123. In FIG. 6A, the EL layer 122R includes, from the conductive film 121 side, a carrier-injection layer 141R, a carrier-transport layer 142R, a light-emitting layer 143R, a carrier-transport layer 144R, and a carrier-injection layer 145R.

For example, when the conductive film 121 and the conductive film 123 serve as an anode and a cathode, respectively, a material having high hole-injection properties is used for the carrier-injection layer 141R, a material having high hole-transport properties is used for the carrier-transport layer 142R, a material having high electron-transport properties is used for the carrier-transport layer 144R, and a material having high electron-injection properties is used for the carrier-injection layer 145R. Note that in the case where the anode and the cathode are interchanged, the order of the layers therebetween can be changed.

Similarly, the EL layer 122B of the display element 721B includes a carrier-injection layer 141B, a carrier-transport layer 142B, a light-emitting layer 143B, a carrier-transport layer 144B, and a carrier-injection layer 145B. The EL layer 122G of the display element 721G includes a carrier-injection layer 141G, a carrier-transport layer 142G, a light-emitting layer 143G, a carrier-transport layer 144G, and a carrier-injection layer 145G.

By independently forming the EL layer 122R, the EL layer 122B, and the EL layer 122G, the element structure in which each of the display elements is optimized can be obtained. For example, layers of different materials can be used as the EL layer 122R, the EL layer 122B, and the EL layer 122G. Owing to this, the color purity, emission efficiency, light extraction efficiency, and the like can be extremely high.

Although, the thicknesses of the layers included in the EL layers are substantially the same between the display elements in the drawing, the thicknesses of the layers may be different from each other.

Figure 6B:
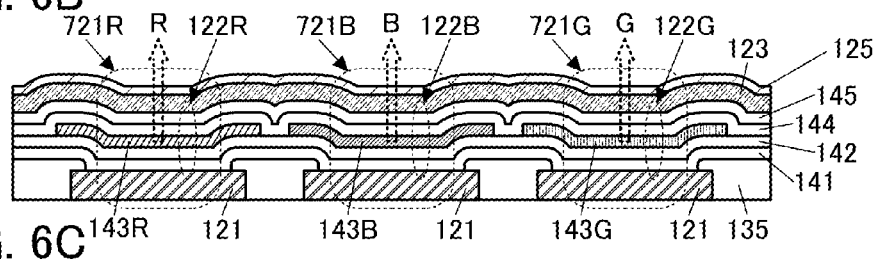

FIG. 6B shows an example in which only light-emitting layers are formed separately for the display elements and other layers are shared by the display elements.

The carrier-injection layer 141, the carrier-transport layer 142, the carrier-transport layer 144, and the carrier-injection layer 145 are provided over the display elements.

With such a structure, the fabrication process can be simplified.

Note that one or more of the carrier-injection layer 141, the carrier-transport layer 142, the carrier-transport layer 144, and the carrier-injection layer 145 may be separately formed.

In the case where both a display element in which a phosphorescent light-emitting material is used for its light-emitting layer and a display element in which a fluorescent light-emitting material is used for its light-emitting layer are included, it is preferable that layers not shared therebetween be formed separately and other layers be shared by the display elements.

Figure 6C:
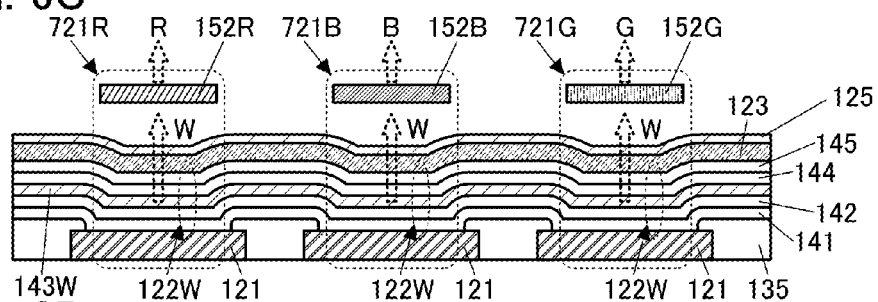

FIG. 6C shows an example in which the same-structure EL layer is used for the display elements showing different colors. In the example of the structure, specifically, an EL layer 122W emitting white light is combined with color films of display elements to emit light of different colors.

The display element 721R, the display element 721B, and the display element 721G include the color film 152R, the color film 152B, and the color film 152G, respectively.

The EL layer 122W included in each of the display element 721R, the display element 721B, and the display element 721G is shared by the different display elements. Thus, the formation process can be simplified as compared with the case where the EL layers 122W are separately formed. As compared with the case where the EL layers are formed separately for the display elements showing different colors, the distance between adjacent pixels can be further reduced and the resolution can be increased because there is no need to consider design rules, which is defined by the minimum processing dimension, alignment accuracy, and the like for formation of the EL layers.

Note that a microcavity (micro resonator) structure may be employed using a semi-transmissive and semi-reflective conductive film as the conductive film 123. In the structure, an optical adjustment layer that transmits visible light may be provided to adjust the optical length between the conductive film 121 and the conductive film 123. The thickness of the optical adjustment layer preferably differs between the display elements showing different colors.

The combination of the EL layer 122 emitting white light, the microcavity structure, and the color film makes it possible to emit light with extremely high color purity toward the display surface side.

Figure 6D:
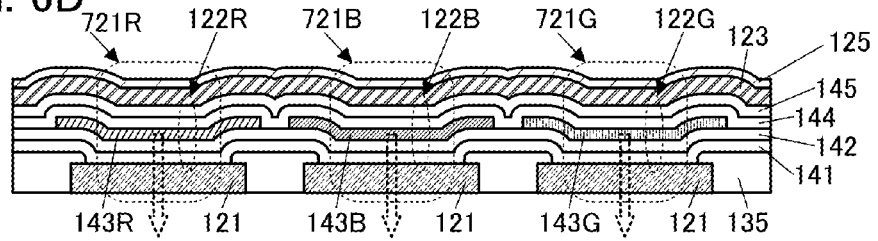

FIG. 6D shows an example using a bottom-emission display element emitting light toward the formation surface side. In the example, only light-emitting layers are formed separately for display elements as in FIG. 6B.

In FIG. 6D, a conductive film that transmits visible light and a conductive film that reflects visible light are used as the conductive film 121 and the conductive film 123, respectively. With this structure, the display element 721R, the display element 721B, and the display element 721G emit light to the conductive film 121 side.

Figure 6E:
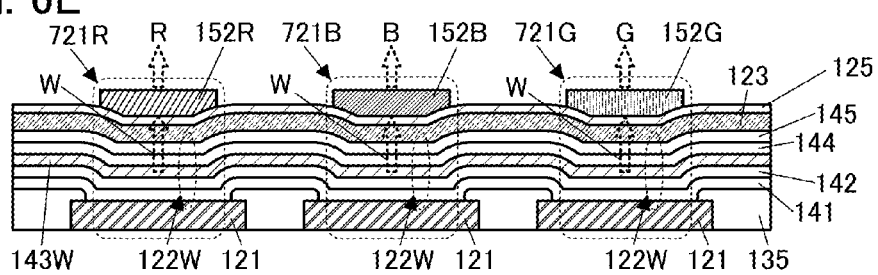

FIG. 6E shows an example in which the same-structure EL layer is used for the display elements showing different colors. In the example of the structure, specifically, the EL layer 122W emitting white light is combined with color films of display elements to emit light of different colors.

FIG. 6E shows a modification example of FIG. 6C, where the display element 721R, the display element 721B, and the display element 721G include the color film 152R, the color film 152B, and the color film 152G, respectively, over the protective film 125.

The above is the description of the structure examples of the light-emitting elements.

Figure 5C:
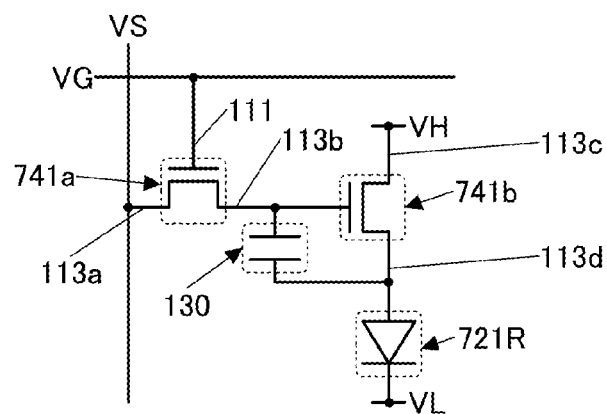

FIG. 5C is a circuit diagram for the structure illustrated in FIG. 5B. FIG. 5C is a circuit diagram for one pixel (sub-pixel).

For example, a gate (the conductive film 111) of the transistor 741a is electrically connected to a wiring to which a gate signal VG is supplied. One of a source and a drain (the conductive film 113a) of the transistor 741a is electrically connected to a wiring to which a source signal VS is supplied. One of a source and a drain (the conductive film 113c) of the transistor 741b is electrically connected to a wiring to which a potential VH is supplied. The common electrode (the conductive film 123) of the display element 721R is electrically connected to a wiring to which a potential VL is supplied.

Note that the pixel structure is not limited to this example and a variety of circuit configurations can be used.

<Stacked Structure of Transistors>

Described below are other structure examples in which two transistors are stacked. The structure examples described below can be combined as appropriate with the above-described cross-sectional structure examples of the display device.

Structure Example 1

Figure 7A:
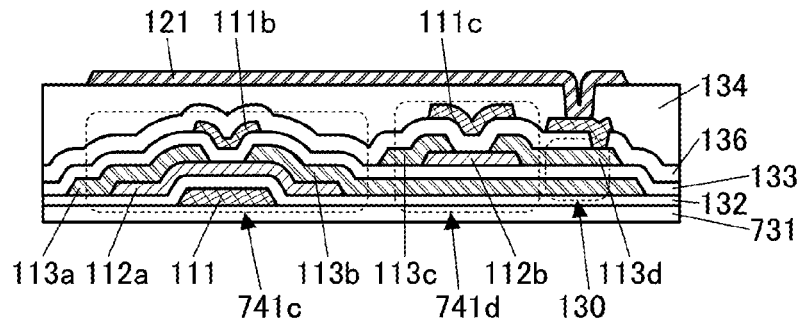
FIGS. 7A to 7E each illustrate a display device according to one embodiment.

FIG. 7A illustrates an example in which a transistor 741c and a transistor 741d are stacked.

The transistor 741c corresponds to the transistor 741a illustrated in FIG. 5B further including a conductive film 111b serving as a second gate. The conductive film 111b is provided so as to overlap with the semiconductor film 112a and is positioned between the insulating film 133 and the insulating film 136.

The transistor 741d corresponds to the transistor 741b illustrated in FIG. 5B further including a conductive film 111c serving as a second gate. The conductive film 111c is provided so as to overlap with the semiconductor film 112b and is positioned over the insulating film 136.

When a transistor includes two gates between which a semiconductor film is sandwiched, the on-state current of the transistor can be increased by supplying the same potential to the two gates. When a potential for controlling the threshold voltage is supplied to one of the gates and a potential for driving the transistor to the other gate, the threshold voltage of the transistor can be controlled.

Structure Example 2

Figure 7B:
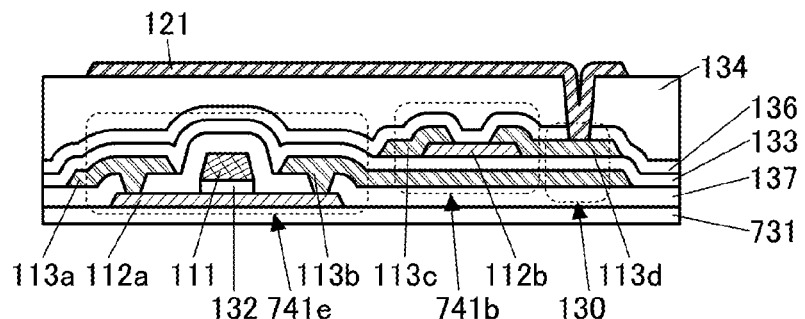

FIG. 7B illustrates an example in which a transistor 741e and the transistor 741b are stacked.

The transistor 741e is a top-gate transistor including a top gate over the semiconductor film 112a.

The transistor 741e includes the semiconductor film 112a over the insulating film 731, the insulating film 132 over the semiconductor film 112a, the conductive film 111 over the insulating film 132, an insulating film 137 covering the semiconductor film 112a and the conductive film 111, and the conductive film 113a and the conductive film 113b over the insulating film 137.

The transistor 741e is preferable because parasitic capacitance between the semiconductor film 112a and the conductive film 113a or the conductive film 113b and parasitic capacitance between the conductive film 111 and the conductive film 113a or the conductive film 113b can be reduced.

Figure 7C:
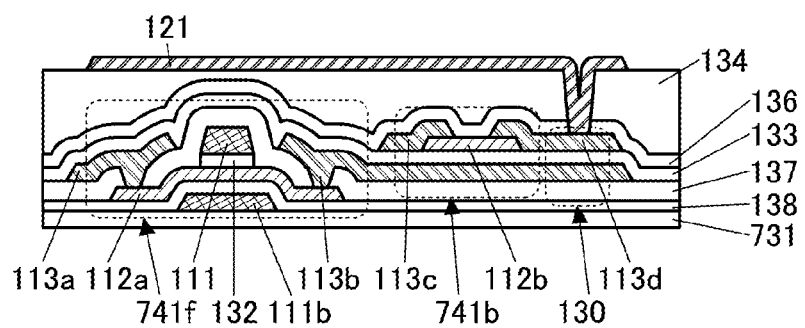
Figure 7D:
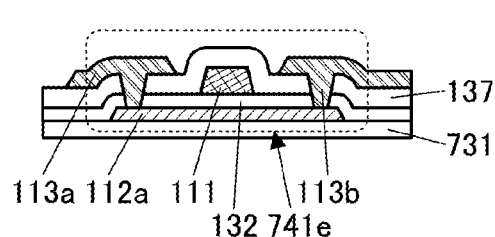

Although the insulating film 132 is formed only in the region overlapping with the conductive film 111 in the example illustrated in FIG. 7B, the insulating film 132 may cover an edge portion of the semiconductor film 112a as illustrated in FIG. 7D.

Structure Example 3

FIG. 7C illustrates an example in which a transistor 741f and the transistor 741b are stacked.

The transistor 741f corresponds to the transistor 741e further including the conductive film 111b serving as a second gate. The conductive film 111b is positioned so as to overlap with the semiconductor film 112a with an insulating film 138 provided therebetween.

Figure 7E:
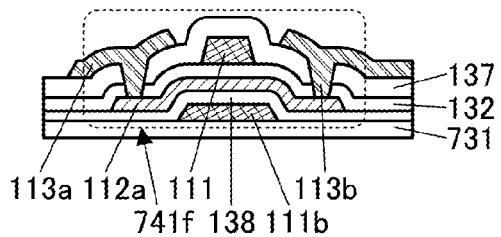

Although the insulating film 132 is formed only in the region overlapping with the conductive film 111 in the example illustrated in FIG. 7C, the insulating film 132 may cover the edge portion of the semiconductor film 112a as illustrated in FIG. 7E.

Structure Example 4

Figure 8A:
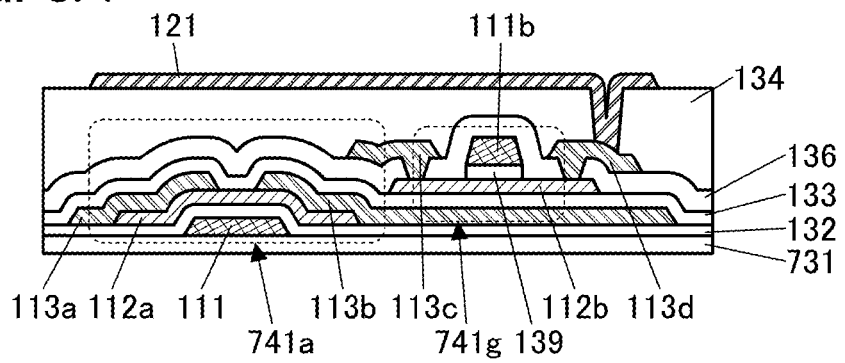
FIGS. 8A to 8D each illustrate a display device according to one embodiment.

FIG. 8A illustrates an example in which the transistor 741a and a transistor 741g are stacked.

The transistor 741g is a top-gate transistor including a top gate over the semiconductor film 112b.

The transistor 741g includes the semiconductor film 112b over the insulating film 133, an insulating film 139 functioning as a gate insulating film over the semiconductor film 112a, the conductive film 111b over the insulating film 139, the insulating film 136 covering the semiconductor film 112a and the conductive film 111b, and the conductive film 113c and the conductive film 113d over the insulating film 136.

The conductive film 113b and the conductive film 111b each function as a gate of the transistor 741g.

In the example illustrated in FIG. 8A, a capacitor consists of part of the semiconductor film 112b, part of the conductive film 113b, and part of the insulating film 133. The capacitor may be used as a storage capacitor. In that case, another capacitor is not necessarily provided.

Although the insulating film 139 is formed only in the region overlapping with the conductive film 111b in the example of FIG. 8A, the insulating film 139 may cover the edge portion of the semiconductor film 112b like the insulating film 132 in FIG. 7E and the like.

Structure Example 5

Figure 8B:
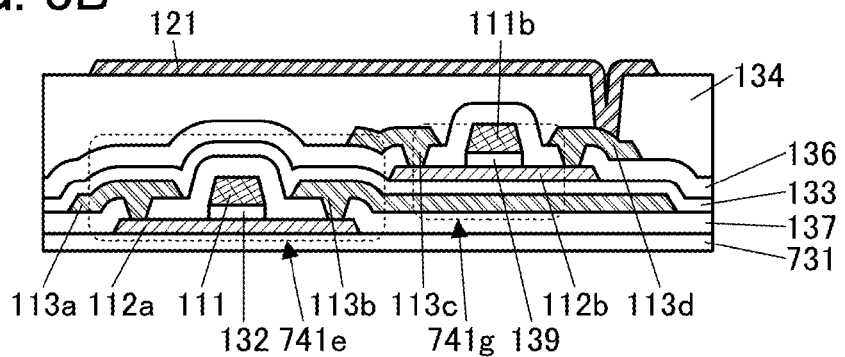

FIG. 8B illustrates an example in which the transistor 741e and the transistor 741g are stacked. For the transistor 741e and the transistor 741g, the above description can be referred to.

This structure enables a display device with extremely low parasitic capacitance.

Structural Example 6

Figure 8C:
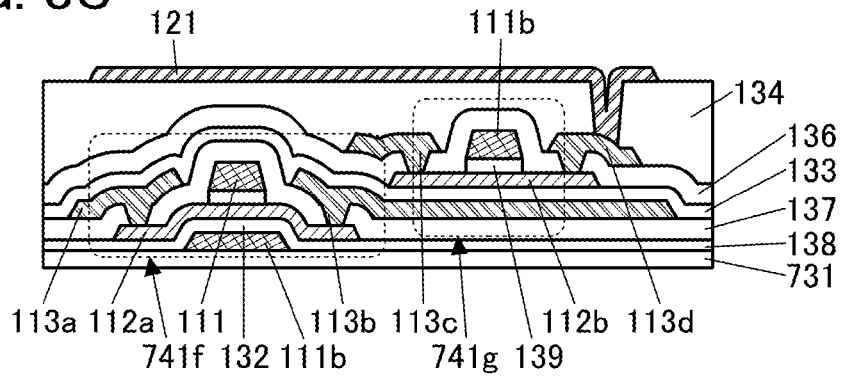

FIG. 8C illustrates an example in which the transistor 741f and the transistor 741g are stacked. For the transistor 741f and the transistor 741g, the above description can be referred to.

This structure enables a display device with extremely low parasitic capacitance.

Structural Example 7

Figure 8D:
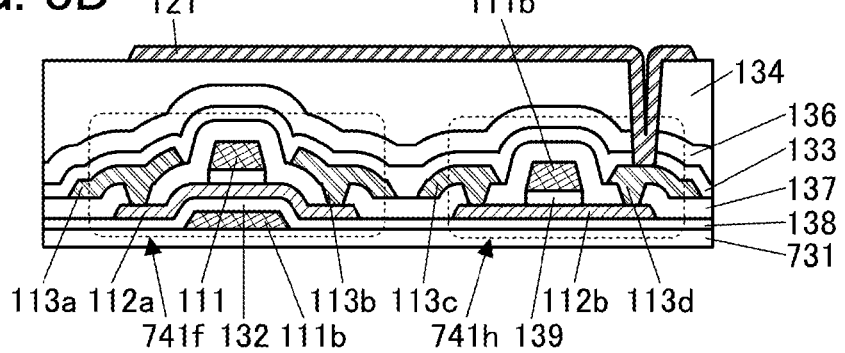

FIG. 8D illustrates an example in which the transistor 741f and a transistor 741h are not stacked. For the transistor 741f, the above description can be referred to.

The transistor 741h includes the semiconductor film 112b over the insulating film 138, the insulating film 139 over the semiconductor film 112b, the conductive film 111b over the insulating film 139, the insulating film 137 covering the semiconductor film 112b and the conductive film 111b, and the conductive film 113c and the conductive film 113d over the insulating film 137.

The above is the description of the examples of the stacked structure of the transistors.

<Components>

The above-described components will be described below.

<Substrate>

A material having a flat surface can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display device can be reduced by using a thin substrate. A flexible display device can be obtained by using a substrate that is thin enough to have flexibility.

Since the substrate through which light is not extracted does not need to have a light-transmitting property, a metal substrate or the like can be used, other than the above-mentioned substrates. A metal substrate, which has high thermal conductivity, is preferable because it can easily conduct heat to the whole substrate and accordingly can prevent a local temperature rise in the display device. To obtain flexibility and bendability, the thickness of a metal substrate is preferably greater than or equal to 10 μm and less than or equal to 200 μm, further preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include glass which is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass, metal, or the like that is thin enough to have flexibility can be used as the substrate. Alternatively, a composite material where glass and a resin material are attached to each other with an adhesive may be used.

A hard coat film (e.g., silicon nitride, aluminum oxide) by which a surface of a display device is protected from damage or the like, a film (e.g., an aramid resin) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of films. When a glass substrate is used, a barrier property against water and oxygen can be improved and thus a highly reliable display device can be provided.

<Transistor>

The transistor includes a conductive film serving as a gate electrode, a semiconductor film, a conductive film serving as a source electrode, a conductive film serving as a drain electrode, and an insulating film serving as a gate insulating film. In the above, a bottom-gate transistor is used.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

As a semiconductor material used for a semiconductor film of the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because a current that flows through the transistor when it is in an off state can be reduced.

For the semiconductor film, it is particularly preferable to use an oxide semiconductor including a plurality of crystal parts whose c-axes are aligned substantially perpendicular to a surface on which the semiconductor film is formed or the top surface of the semiconductor film and in which a grain boundary is not observed between adjacent crystal parts.

There is no grain boundary in such an oxide semiconductor; therefore, generation of a crack in an oxide semiconductor film which is caused by stress when a display device is bent is prevented. Therefore, such an oxide semiconductor can be favorably used for a flexible display device which is used in a bent state, or the like.

Moreover, the use of such a crystalline oxide semiconductor for the semiconductor film makes it possible to provide a highly reliable transistor with a small change in electrical characteristics.

In a transistor with an oxide semiconductor whose band gap is larger than the band gap of silicon, charges stored in a capacitor that is connected in series to the transistor can be held for a long time, owing to the low off-state current of the transistor. When such a transistor is used for a pixel, operation of a driver circuit can be stopped while the gray scale of an image displayed in display regions is maintained. As a result, a display device with extremely low power consumption is obtained.

The semiconductor film preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to In, Zn, and M.

Examples of the stabilizer, including metals that can be used as M, are gallium, tin, hafnium, aluminum, and zirconium. As another example of the stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor film, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. In addition to In, Ga, and Zn, another metal element may be contained.

The semiconductor film and the conductive film may include the same metal element contained in the above oxide. The use of the same metal element for the semiconductor film and the conductive film can reduce the manufacturing cost. For example, the use of metal oxide targets with the same metal composition can reduce the manufacturing cost. In addition, the same etching gas or the same etchant can be used in processing the semiconductor film and the conductive film. Note that even when the semiconductor film and the conductive film include the same metal elements, they have different compositions in some cases. For example, a metal element in a film is released during the manufacturing process of the transistor and the capacitor, which might result in different metal compositions.

The energy gap of the oxide semiconductor included in the semiconductor film is 2 eV or more, preferably 2.5 eV or more, and further preferably 3 eV or more. The use of such an oxide semiconductor having a wide energy gap leads to a reduction in the off-state current of a transistor.

In the case where the oxide semiconductor included in the semiconductor film is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1, In:M:Zn=5:1:7 and the like are preferable. Note that the atomic ratio of metal elements in the formed semiconductor film varies from the above atomic ratio of metal elements of the sputtering target within a range of ±40% as an error.

An oxide semiconductor film with low carrier density is used as the semiconductor layer. For example, the semiconductor film is an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor film be set to appropriate values.

When silicon or carbon that is one of elements belonging to Group 14 is contained in the oxide semiconductor contained in the semiconductor film, oxygen vacancies are increased in the semiconductor film, and the semiconductor film becomes n-type. Thus, the concentration of silicon or carbon (measured by secondary ion mass spectrometry) in the semiconductor film is lower than or equal to $2\times10^{18}$ atoms/cm³, preferably lower than or equal to $2\times10^{17}$ atoms/cm³.

Alkali metal and alkaline earth metal might generate carriers when bonded to an oxide semiconductor, in which case the off-state current of the transistor might be increased. Therefore, the concentration of alkali metal or alkaline earth metal of the semiconductor film, which is measured by secondary ion mass spectrometry, is lower than or equal to $1\times10^{18}$ atoms/cm³, preferably lower than or equal to $2\times10^{16}$ atoms/cm³.

When nitrogen is contained in the oxide semiconductor contained in the semiconductor film, electrons serving as carriers are generated and the carrier density increases, so that the semiconductor film easily becomes n-type. Thus, a transistor including an oxide semiconductor which contains nitrogen is likely to be normally on. Hence, the concentration of nitrogen in the semiconductor film which is measured by secondary ion mass spectrometry is preferably lower than or equal to $5\times10^{18}$ atoms/cm³.

The semiconductor film may have a non-single-crystal structure, for example. The non-single-crystal structure includes CAAC-OS (c-axis aligned crystalline oxide semiconductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor film may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

The semiconductor film can be formed using the above-described CAC-OS or CAC-metal oxide.

A transistor including CAC-OS is highly reliable. The transistor including CAC-OS has excellent transistor characteristics because of high on-state current, high field-effect mobility, and low off-state current. Thus, the CAC-OS is suitably used in a variety of semiconductor devices typified by a display.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where the display portion with extremely high definition is provided, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor film, materials with low heat resistance can be used for a wiring, an electrode, or a substrate below the semiconductor film, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single-crystal silicon, or the like is particularly preferable.

<Conductive Film>

As materials for the gates, the source, and the drain of a transistor, and the conductive film serving as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a layered structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium or an alloy material containing any of these metal materials can be used. Alternatively, a nitride of the metal material (e.g., titanium nitride) or the like may be used. In the case of using the metal material or the alloy material (or the nitride thereof), the thickness is set small enough to allow light transmission. Alternatively, a layered film of any of the above materials can be used as the conductive film. For example, a layered film of indium tin oxide and an alloy of silver and magnesium is preferably used because the conductivity can be increased. They can also be used for conductive films such as a variety of wirings and electrodes included in a display device, and conductive films (e.g., conductive films serving as a pixel electrode or a common electrode) included in a display element.

<Insulating Film>

Examples of an insulating material that can be used for the insulating films include a resin such as acrylic or epoxy resin, a resin having a siloxane bond (e.g., silicone resin), and an inorganic insulating material such as silicon oxide, silicon oxynitride, silicon nitride oxide, silicon nitride, or aluminum oxide.

The light-emitting element is preferably provided between a pair of insulating films with low water permeability, in which case entry of impurities such as water into the light-emitting element can be inhibited. Thus, a decrease in device reliability can be suppressed.

As an insulating film with low water permeability, a film containing nitrogen and silicon, such as a silicon nitride film or a silicon nitride oxide film, a film containing nitrogen and aluminum, such as an aluminum nitride film, or the like can be used. Alternatively, a silicon oxide film, a silicon oxynitride film, an aluminum oxide film, or the like may be used.

For example, the amount of water vapor transmission of the insulating film with low water permeability is lower than or equal to $1\times10^{-5}$ [$g/(m^2 \cdot day)$], preferably lower than or equal to $1\times10^{-6}$ [$g/(m^2 \cdot day)$], further preferably lower than or equal to $1\times10^{-7}$ [$g/(m^2 \cdot day)$], still further preferably lower than or equal to $1\times10^{-8}$ [$g/(m^2 \cdot day)$].

Moreover, the protective film described in Embodiment 1 can be used as appropriate as an insulating film included in the display device.

<Light-Emitting Element>

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element can have a top emission structure, a bottom emission structure, a dual emission structure, and the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances that emit light of red (R), green (G), blue (B), yellow (Y), orange (O), and the like and light-emitting substances that emit light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material that emits light of one color and a light-emitting layer containing a light-emitting material that emits light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stack of indium tin oxide and an alloy of silver and magnesium is preferably used, in which case conductivity can be increased. Still alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dot can function as a light-emitting material.

The quantum dot may be a colloidal quantum dot, an alloyed quantum dot, a core-shell quantum dot, a core quantum dot, or the like. A quantum dot containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

<Adhesive>

As the adhesive, any of a variety of curable adhesives, e.g., a photo-curable adhesive such as an ultraviolet curable adhesive, a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can inhibit entry of impurities such as moisture into an element, leading to an improvement in the reliability of the display device.

In addition, a filler with a high refractive index or a light-scattering member may be mixed into the resin, in which case light extraction efficiency can be improved. For example, titanium oxide, barium oxide, zeolite, or zirconium can be used.

<Connection Member>

As a connection member, an anisotropic conductive film (ACF), an anisotropic conductive paste (ACP), or the like can be used.

<Color Film>

Examples of a material that can be used for the color films include a metal material, a resin material, and a resin material containing a pigment or dye.

<Light-Blocking Film>

Examples of a material that can be used for the light-blocking film include carbon black, titanium black, a metal, a metal oxide, and a composite oxide containing a solid solution of a plurality of metal oxides. The light-blocking film may be a film containing a resin material or a thin film of an inorganic material such as a metal. Stacked films containing the material of the color film can also be used for the light-blocking film. For example, a stacked-layer structure of a film containing a material of a color film which transmits light of a certain color and a film containing a material of a color film which transmits light of another color can be employed. It is preferable that the color film and the light-blocking film be formed using the same material because the same manufacturing apparatus can be used and the process can be simplified.

The above is the description of each of the components.

<Manufacturing Method>

Here, manufacturing method examples of a display device using a flexible substrate are described.

Here, layers including a display element, a circuit, a wiring, an electrode, optical members such as a color film and a light-blocking film, an insulating film, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 $\mu$m and the like.

As a method for forming an element layer over a flexible substrate having an insulating surface, typically, there are two methods shown below. One of them is to directly form an element layer over the substrate. The other method is to form an element layer over a support substrate that is different from the substrate and then to separate and transfer the element layer from the support substrate to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a support substrate, in which case transfer thereof in an apparatus and between apparatuses can be easy.

In the case of employing the method in which the element layer is formed over the support substrate and then transferred to the substrate, first, a separation film and an insulating film are stacked over the support substrate, and then the element layer is formed over the insulating film. Next, the element layer is separated from the support substrate and then transferred to the substrate. At this time, selected is a material with which separation at an interface between the support substrate and the separation film, at an interface between the separation film and the insulating film, or in the separation film occurs. In the method, it is preferable that a material having high heat resistance be used for the support substrate or the separation film, in which case the upper limit of the temperature applied when the element layer is formed can be increased, and an element layer including a more highly reliable element can be formed.

For example, it is preferable that a stack of a film containing a high-melting-point metal material, such as tungsten, and a film containing an oxide of the metal material be used as the separation film, and a stack of a plurality of films such as a silicon oxide film, a silicon nitride film, a silicon oxynitride film, and a silicon nitride oxide film be used as the insulating film over the separation film. Note that in this specification, oxynitride contains more oxygen than nitrogen, and nitride oxide contains more nitrogen than oxygen.

As the method for separating the support substrate from the element layer, applying mechanical force, etching the separation film, and making a liquid permeate the separation interface are given as examples. Alternatively, separation may be performed by performing heating or cooling by utilizing a difference in thermal expansion coefficient of two layers which form the separation interface.

The separation film is not necessarily provided in the case where the separation can be performed at an interface between the support substrate and the insulating film.

For example, glass and an organic resin such as polyimide can be used as the support substrate and the insulating film, respectively. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat generation member may be provided between the support substrate and the insulating film formed of an organic resin, and separation may be performed at an interface between the heat generation member and the insulating film by heating the heat generation member. As the heat generation member, any of a variety of materials such as a material which generates heat when current flows therethrough, a material which generates heat by absorbing light, and a material which generates heat when a magnetic field is applied thereto can be used. For example, for the heat generation member, a material selected from a semiconductor, a metal, and an insulator can be used.

In the above-described methods, the insulating film formed of an organic resin can be used as a substrate after the separation.

The above is the description of the manufacturing method of the flexible display device.

At least part of this embodiment can be implemented in combination with any of the other embodiments described in this specification as appropriate.

Embodiment 4

In this embodiment, a hybrid display which is an example of the display device according to one embodiment of the present invention will be described.

Note that a hybrid display method is a method for displaying a plurality of lights in one pixel or one subpixel to display a letter and/or an image. A hybrid display is an aggregate which displays a plurality of lights in one pixel or one subpixel included in a display portion to display a letter and/or an image.

As an example of the hybrid display method, a method in which first light and second light are displayed with different timings in one pixel or one subpixel can be given. At this time, in one pixel or one subpixel, the first light and the second light having the same color tone (any one of red, green, and blue, or any one of cyan, magenta, and yellow) can be displayed at the same time, and a letter and/or an image can be displayed on a display portion.

As another example of the hybrid display method, a method in which reflected light and self-emission light are displayed in one pixel or one subpixel can be given. Reflected light and self-emission light (e.g., light emitted from an organic light-emitting diode (OLED) and light emitted from a light-emitting diode (LED)) having the same color tone can be displayed at the same time in one pixel or one subpixel.

Note that in a hybrid display method, a plurality of lights may be displayed in not one pixel or one subpixel but adjacent pixels or adjacent subpixels. Furthermore, displaying first light and second light at the same time means displaying the first light and the second light for the same length of time to the extent that flickering is not perceived by a viewer's eye. As long as flickering is not perceived by a viewer's eye, the display period of the first light may deviate from the display period of the second light.

Moreover, the hybrid display is an aggregate which includes a plurality of display elements in one pixel or one subpixel and in which each of the plurality of display elements performs display in the same period. The hybrid display includes the plurality of display elements and active elements for driving the display elements in one pixel or one subpixel. As the active elements, switches, transistors, thin film transistors, or the like can be given. The active element is connected to each of the plurality of display elements, so that display of the plurality of display elements can be individually controlled.

Note that in the present specification and the like, a display method satisfying any one or a plurality of the above-described structures is referred to as hybrid display.

Furthermore, a hybrid display includes a plurality of display elements in one pixel or one subpixel. Note that as the plurality of display elements, reflective elements that reflect light and self-luminous elements that emit light can be given, for example. Note that the reflective element and the self-luminous element can be controlled independently. A hybrid display has a function of displaying a letter and/or an image using one or both of reflected light and self-emitted light in a display portion.

The display device of one embodiment of the present invention can include a pixel in which a first display element that reflects visible light is provided. Alternatively, the display device can include a pixel in which a second display element that emits visible light is provided. Alternatively, the display device can include a pixel in which such a first display element and such a second display element are provided.

In this embodiment, a display device including a first display element that reflects visible light and a second display element that emits visible light is described.

The display device has a function of displaying an image utilizing first light reflected from the first display element and/or second light emitted from the second display element. Alternatively, the display device has a function of expressing gray scales by individually controlling the amount of the first light reflected from the first display element and the amount of the second light emitted from the second display element.

The display device preferably includes a first pixel that expresses gray scales by controlling the amount of light reflected from the first display element and a second pixel that expresses gray scales by controlling the amount of light emitted from the second display element. For example, the first pixels and the second pixels are arranged in a matrix to form a display portion.

It is preferable that the first pixels and the second pixels be the same in number and be arranged with the same pitch in a display region. Here, the adjacent first and second pixels can be collectively referred to as a pixel unit. Accordingly, as described later, an image displayed by only a plurality of first pixels, an image displayed by only a plurality of second pixels, and an image displayed by both the plurality of first pixels and the plurality of second pixels can be displayed in the same display region.

As the first display element included in the first pixel, an element that performs display by reflecting external light can be used. Such an element does not include a light source, and thus, the power consumption for display can be significantly reduced.

As the first display element, typically, a reflective liquid crystal element can be used. Alternatively, as the first display element, a microelectromechanical systems (MEMS) shutter element, an optical interference type MEMS element, an element to which a microcapsule method, an electrophoretic method, an electrowetting method, an Electronic Liquid Powder (registered trademark) method, or the like is applied, or the like can be used.

As the second display element included in the second pixel, an element that performs display by utilizing light from its own light source can be used. Specifically, it is preferable to use an electroluminescent element in which light emission can be extracted from a light-emitting substance by application of an electric field. Since the luminance and the chromaticity of light emitted from such a pixel are not affected by external light, display with high color reproducibility (a wide color gamut) and high contrast can be performed; that is, a clear image can be displayed.

As the second display element, a self-luminous light-emitting element such as an OLED, a light-emitting diode (LED), a quantum-dot light-emitting diode (QLED), or a semiconductor laser can be used. Alternatively, a combination of a backlight that serves as a light source and a transmissive liquid crystal element that controls the amount of light from the backlight transmitted therethrough may be used as the display element included in the second pixel.

The first pixel can include, for example, a subpixel exhibiting white (W) or subpixels each exhibiting light of corresponding one of three colors, red (R), green (G), and blue (B). Similarly, the second pixel can include, for example, a subpixel exhibiting white (W) or subpixels each exhibiting light of corresponding one of three colors, red (R), green (G), and blue (B). Note that the first pixel and the second pixel may each include subpixels of four or more colors. As the number of kinds of subpixels is increased, the power consumption can be reduced and the color reproducibility can be improved.

In one embodiment of the present invention, the display mode can be switched between a first mode in which an image is displayed by the first pixels, a second mode in which an image is displayed by the second pixels, and a third mode in which an image is displayed by the first pixels and the second pixels. Different image signals may be input to the first pixels and the second pixels so that a composite image can be displayed.

In the first mode, an image is displayed using light reflected from the first display element. The first mode, which requires no light source, is a driving mode with extremely low power consumption. For example, the first mode is effective in the case where external light is white or near-white light with sufficiently high illuminance. The first mode is a display mode suitable for displaying text data of a book, a document or the like. The use of reflected light enables eye-friendly display, thereby mitigating eye strain.

In the second mode, an image is displayed utilizing light emitted from the second display element. Thus, an extremely clear image can be displayed (display with high contrast and high color reproducibility can be performed) regardless of the illuminance and the chromaticity of external light. For example, the second mode is effective when the illuminance of external light is extremely low, e.g., during the night or in a dark room. When a bright image is displayed under weak external light, a user may feel that the image is too bright. To prevent this, an image with reduced luminance is preferably displayed in the second mode. Thus, excessive brightness can be suppressed, and the power consumption can be reduced. The second mode is suitable for displaying a clear image, a smooth moving image, or the like.

In the third mode, display is performed utilizing both light reflected from the first display element and light emitted from the second display element. Specifically, in the driving mode, light from the first pixel and light from the second pixel adjacent to the first pixel are mixed to express one color. An image can be displayed more clearly than in the first mode, and the power consumption can be lower than that in the second mode. For example, the third mode is effective when the illuminance of external light is relatively low, e.g., under indoor illumination or in the morning or evening, or when the external light does not represent a white chromaticity.

A more specific example of one embodiment of the present invention will be described below with reference to drawings.

[Structure Example of Display Device]

Figure 9:
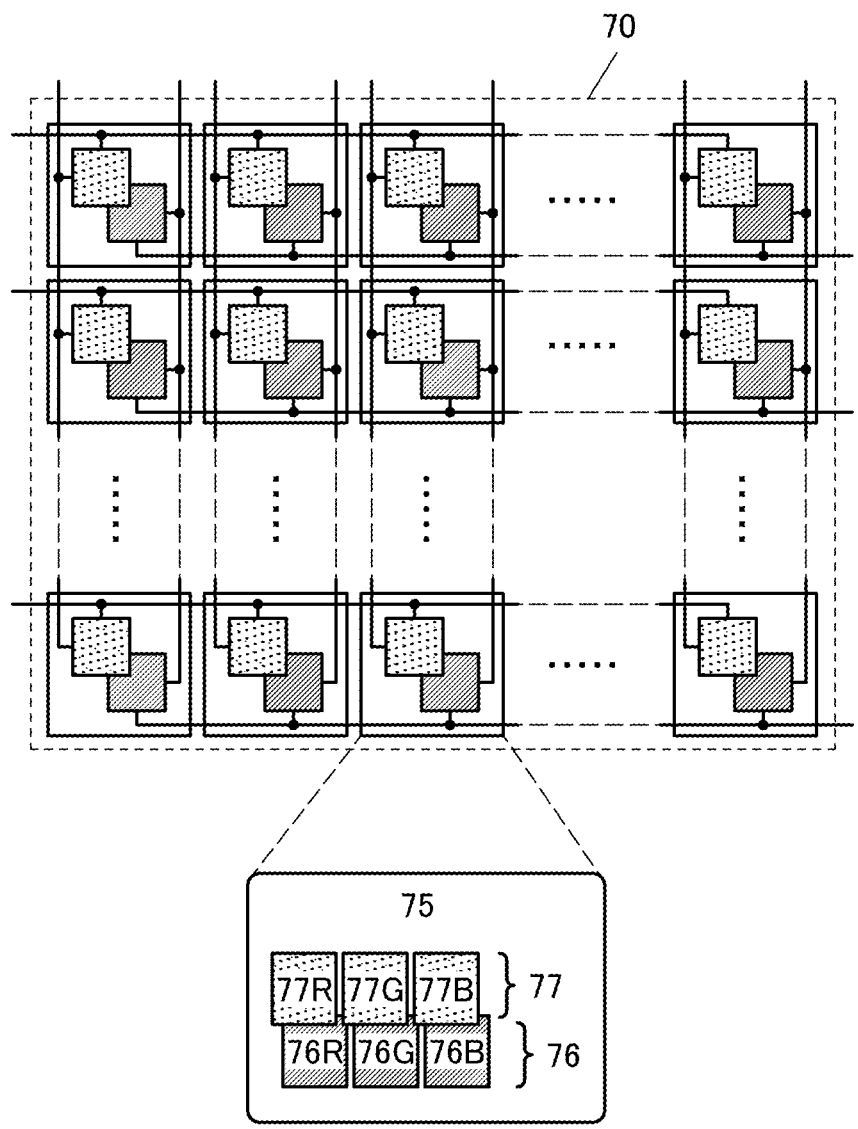
FIG. 9 illustrates pixel units.

FIG. 9 illustrates a display region 70 included in the display device according to one embodiment of the present invention. The display region 70 includes a plurality of pixel units 75 arranged in a matrix. The pixel units 75 each include a pixel 76 and a pixel 77.

FIG. 9 shows an example in which the pixel 76 and the pixel 77 each include display elements corresponding to three colors of red (R), green (G), and blue (B).

The pixel 76 includes a display element 76R corresponding to red (R), a display element 76G corresponding to green (G), and a display element 76B corresponding to blue (B). The display elements 76R, 76G, and 76B are second display elements utilizing light from a light source.

The pixel 77 includes a display element 77R corresponding to red (R), a display element 77G corresponding to green (G), and a display element 77B corresponding to blue (B). The display elements 77R, 77G, and 77B are first display elements utilizing reflection of external light.

The above is the description of the structure example of the display device.

[Structure Example of Pixel Unit]

Figure 10A:
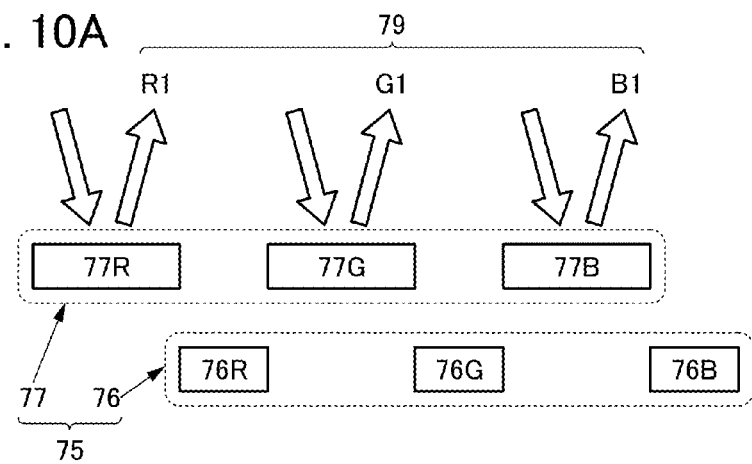
FIGS. 10A to 10C each illustrate a pixel unit.
Figure 10B:
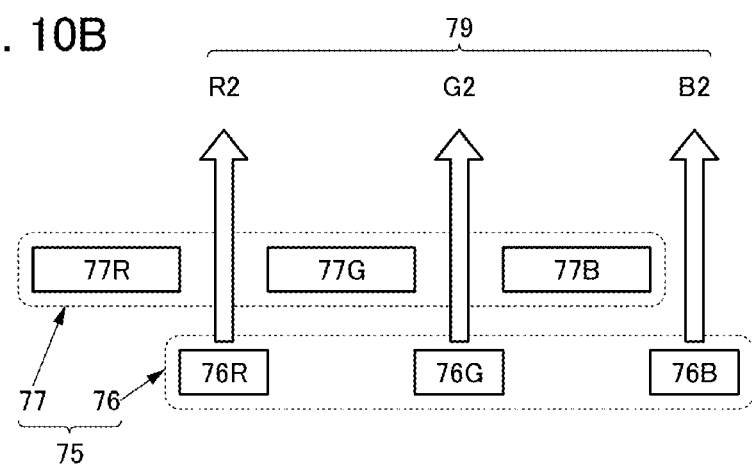
Figure 10C:
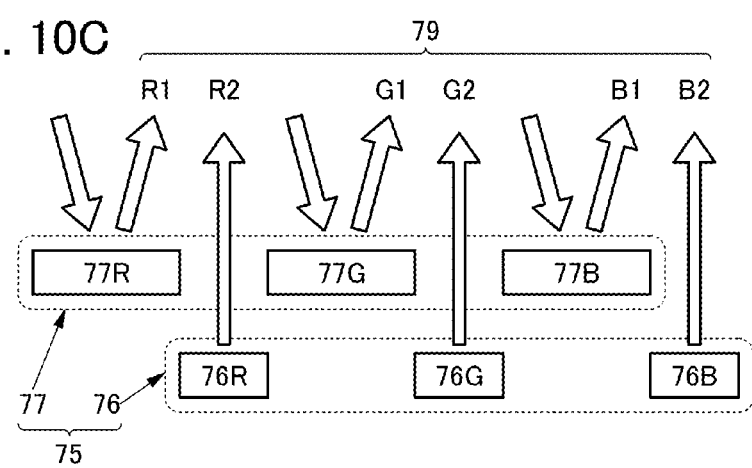

Next, the pixel unit 75 will be described with reference to FIGS. 10A to 10C. FIGS. 10A to 10C are schematic views illustrating structure examples of the pixel unit 75.

The pixel 76 includes the display element 76R, the display element 76G, and the display element 76B. The display element 76R includes a light source and emits, to the display surface side, red light R2 with a luminance corresponding to the gray level of red included in a second gray input to the pixel 76. Similarly, the display element 76G and the display element 76B emit green light G2 and blue light B2, respectively, to the display surface side.

The pixel 77 includes the display element 77R, the display element 77G, and the display element 77B. The display element 77R reflects external light, which is then extracted to the display surface side as red light R1 with a luminance corresponding to the gray level of red included in a first gray level input to the pixel 77. Similarly, green light G1 and blue light B1 are extracted from the display element 77G and the display element 77B, respectively, to the display surface side.

[First Mode]

FIG. 10A shows an example of an operation mode in which an image is displayed by driving the display elements 77R, 77G, and 77B, which reflect external light. As illustrated in FIG. 10A, for example, in the case where the illuminance of external light is sufficiently high, the pixel 76 is not driven and only the colors of the light (the light R1, the light G1, and the light B1) from the pixel 77 are mixed, whereby the light 79 of a predetermined color can be extracted from the pixel unit 75 to the display surface side. Thus, driving with extremely low power consumption can be performed.

[Second Mode]

FIG. 10B shows an example of an operation mode in which an image is displayed by driving the display elements 76R, 76G, and 76B. As illustrated in FIG. 10B, for example, in the case where the illuminance of external light is extremely low, the pixel 77 is not driven and only the colors of the light (the light R2, the light G2, and the light B2) from the pixel 76 are mixed, whereby the light 79 of a predetermined color can be extracted from the pixel unit 75 to the display surface side. Thus, a clear image can be displayed. Furthermore, the luminance is reduced when the illuminance of external light is low, which can prevent glare for a user and reduce power consumption.

[Third Mode]

FIG. 10C shows an example of an operation mode in which an image is displayed by driving both the display elements 77R, 77G, and 77B, which reflect external light, and the display elements 76R, 76G, and 76B, which emit light. As illustrated in FIG. 10C, the six colors of the light, i.e., the light R1, the light G1, the light B1, the light R2, the light G2, and the light B2 are mixed, whereby light 79 of a predetermined color can be extracted from the pixel unit 75 to the display surface side.

Accordingly, the display device described in this embodiment includes light-emitting display elements and reflective display elements, which is favorable for displaying a selected region. For example, when the display region 70 is displayed with the reflective display elements, a selected region can be displayed with the light-emitting display elements. Furthermore, when the display region 70 is displayed with the light-emitting display elements, a selected region may be displayed with the reflective display elements. Alternatively, a selected region may be displayed by changing a grayscale data for the reflective display elements, or by changing the grayscale data for the light-emitting display elements.

The above is the description of the structure example of the pixel unit 75.

Next, a specific structure example of the hybrid display will be described. A display device described below includes both a reflective liquid crystal element and a light-emitting element. The display device can perform display in a transmission mode and in a reflection mode.

Configuration Example

Figure 11A:
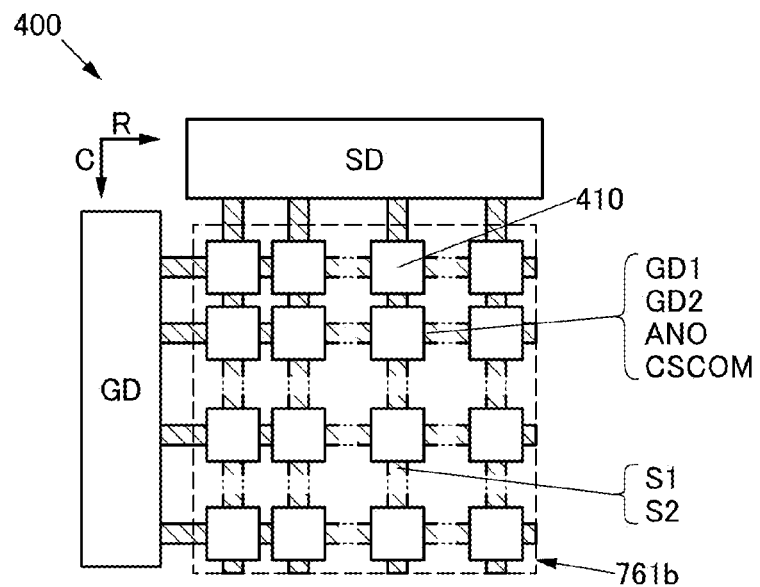
Figure 11A:
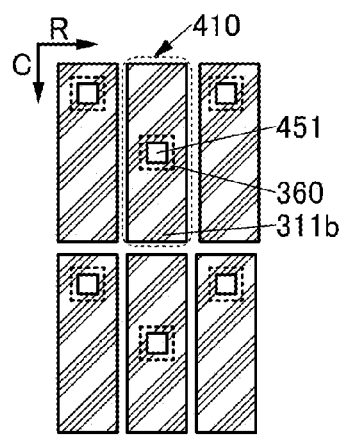
Figure 11A:
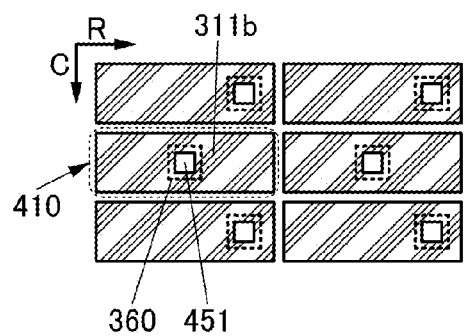

FIG. 11A is a block diagram showing a configuration example of a display device 400. The display device 400 includes a plurality of pixels 410 arranged in a matrix in a display portion 761b. Furthermore, the display device 400 includes a circuit GD and a circuit SD. Furthermore, the display device 400 includes a plurality of wirings GD1, a plurality of wirings GD2, a plurality of wirings ANO, and a plurality of wirings CSCOM which are electrically connected to the circuit GD and the plurality of pixels 410 arranged in the direction R. Furthermore, the display device 400 includes a plurality of wirings S1 and a plurality of wirings S2 which are electrically connected to the circuit SD and the plurality of pixels 410 arranged in the direction C.

Although one circuit GD and one circuit SD are provided here for simplicity, the circuit GD and the circuit SD for driving a liquid crystal element and the circuit GD and the circuit SD for driving a light-emitting element may be separately provided.

The pixel 410 includes a reflective liquid crystal element and a light-emitting element. In the pixel 410, the liquid crystal element and the light-emitting element partly overlap with each other.

FIG. 11B1 shows a configuration example of a conductive film 311b included in the pixel 410. The conductive film 311b functions as a reflective electrode of the liquid crystal element in the pixel 410. The conductive film 311b has an opening 451.

The dashed line in FIG. 11B1 denotes a light-emitting element 360 positioned in a region overlapping with the conductive film 311b. The light-emitting element 360 overlaps with the opening 451 of the conductive film 311b. Thus, light emitted from the light-emitting element 360 is extracted to the display surface side through the opening 451.

In FIG. 11B1, the pixels 410 adjacent in the direction R are pixels of different colors. As illustrated in FIG. 11B1, the openings 451 in two adjacent pixels in the direction R are preferably provided in different positions in the conductive films 311b so as not to be arranged in a line. This allows two adjacent light-emitting elements 360 to be apart from each other, thereby preventing light emitted from the light-emitting element 360 from entering a color film included in the adjacent pixel 410 (such a phenomenon is also referred to as light leakage). Furthermore, since two adjacent light-emitting elements 360 can be arranged apart from each other, a high-resolution display device can be obtained even when EL layers of the light-emitting elements 360 are separately formed with a blocking mask or the like.

Alternatively, the arrangement illustrated in FIG. 11B2 may be employed.

If the ratio of the total area of the opening 451 to the total area excluding the opening is too large, display performed using the liquid crystal element is dark. If the ratio of the total area of the opening 451 to the total area excluding the opening is too small, display performed using the light-emitting element 360 is dark.

If the area of the opening 451 of the conductive film 311*b* functioning as a reflective electrode is too small, the extraction efficiency of light emitted from the light-emitting element 360 is decreased.

The opening 451 may have a polygonal shape, a quadrangular shape, an elliptical shape, a circular shape, a cross-like shape, a stripe shape, a slit shape, or a checkered pattern, for example. The opening 451 may be provided close to the adjacent pixel. The opening 451 is preferably provided close to another pixel displaying the same color, in which case light leakage can be suppressed.

Circuit Configuration Example

Figure 12:
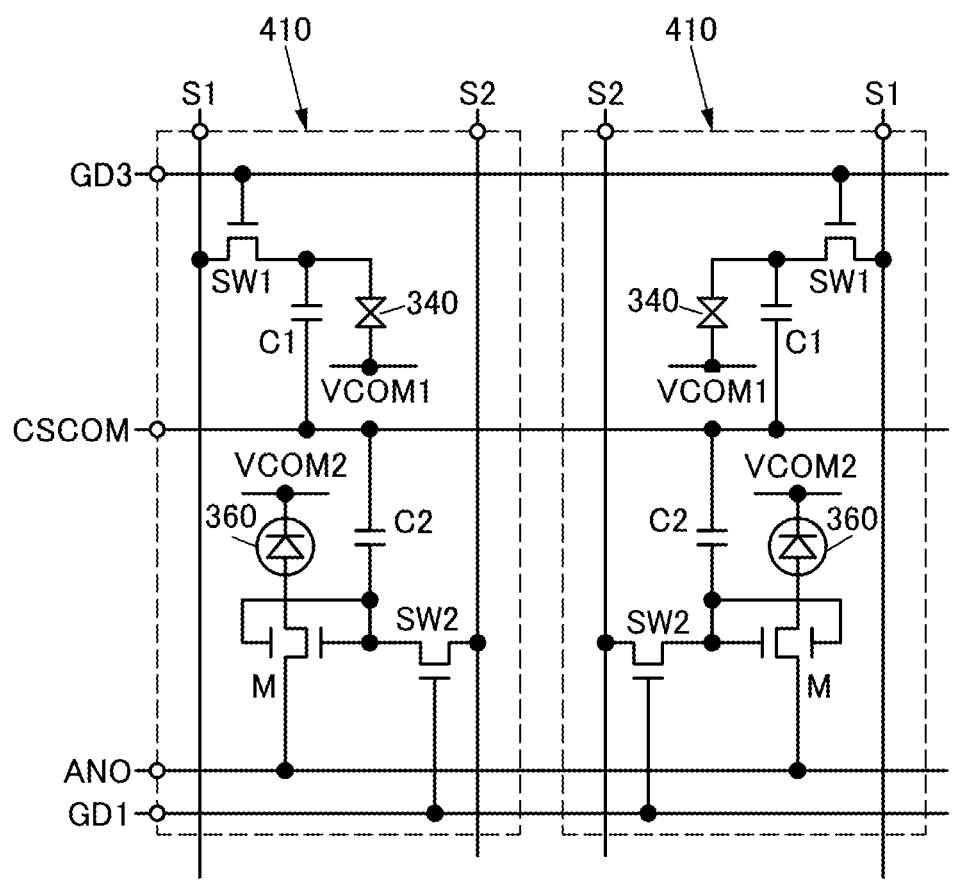
FIG. 12 illustrates a circuit of a display device.

FIG. 12 is a circuit diagram showing a configuration example of the pixel 410. FIG. 12 illustrates two adjacent pixels 410. The example shown in FIG. 12 is different from that in FIG. 9 in including wirings S1 and S2 for writing image data to capacitors included in the pixel circuit.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring GD1, the wiring GD3, the wiring ANO, the wiring CSCOM, the wiring S1, and the wiring S2. FIG. 12 also illustrates a wiring VCOM1 which is electrically connected to the liquid crystal element 340 and a wiring VCOM2 which is electrically connected to the light-emitting element 360.

FIG. 12 shows an example in which transistors are used as the switches SW1 and SW2.

A gate of the switch SW1 is connected to the wiring GD3. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring GD1. One of a source and a drain of the switch SW2 is connected to the wiring S2, and the other of the source and the drain is connected to one electrode of the capacitor C2 and a gate of the transistor M. The other electrode of the capacitor C2 is connected to the wiring CSCOM. The other of the source and the drain of the transistor M is connected to one electrode of the light-emitting element 360. The other electrode of the light-emitting element 360 is connected to the wiring VCOM2.

FIG. 12 shows an example in which the transistor M includes two gates connected to each other with a semiconductor provided therebetween. This structure can increase current that can flow through the transistor M.

The wiring GD3 can be supplied with a signal for controlling the on/off state of the switch SW1. A predetermined potential can be supplied to the wiring VCOM1. The wiring S1 can be supplied with a signal for controlling the alignment of liquid crystal included in the liquid crystal element 340. A predetermined potential can be supplied to the wiring CSCOM.

The wiring GD1 can be supplied with a signal for controlling the on/off state of the switch SW2. The wiring VCOM2 and the wiring ANO can be supplied with potentials having a difference large enough to make the light-emitting element 360 emit light. The wiring S2 can be supplied with a signal for controlling the conduction state of the transistor M.

In the reflective mode, for example, display can be performed by driving the pixel 410 in FIG. 12 with the signals supplied to the wiring GD3 and the wiring S1 and utilizing the optical modulation of the liquid crystal element 340. In the transmissive mode, display can be performed by driving the pixel with the signals supplied to the wiring GD1 and the wiring S2 to make the light-emitting element 360 emit light. In the case where both driving modes are combined, the pixel can be driven with the signals supplied to the wiring GD1, the wiring GD3, the wiring S1, and the wiring S2.

Figure 13A:
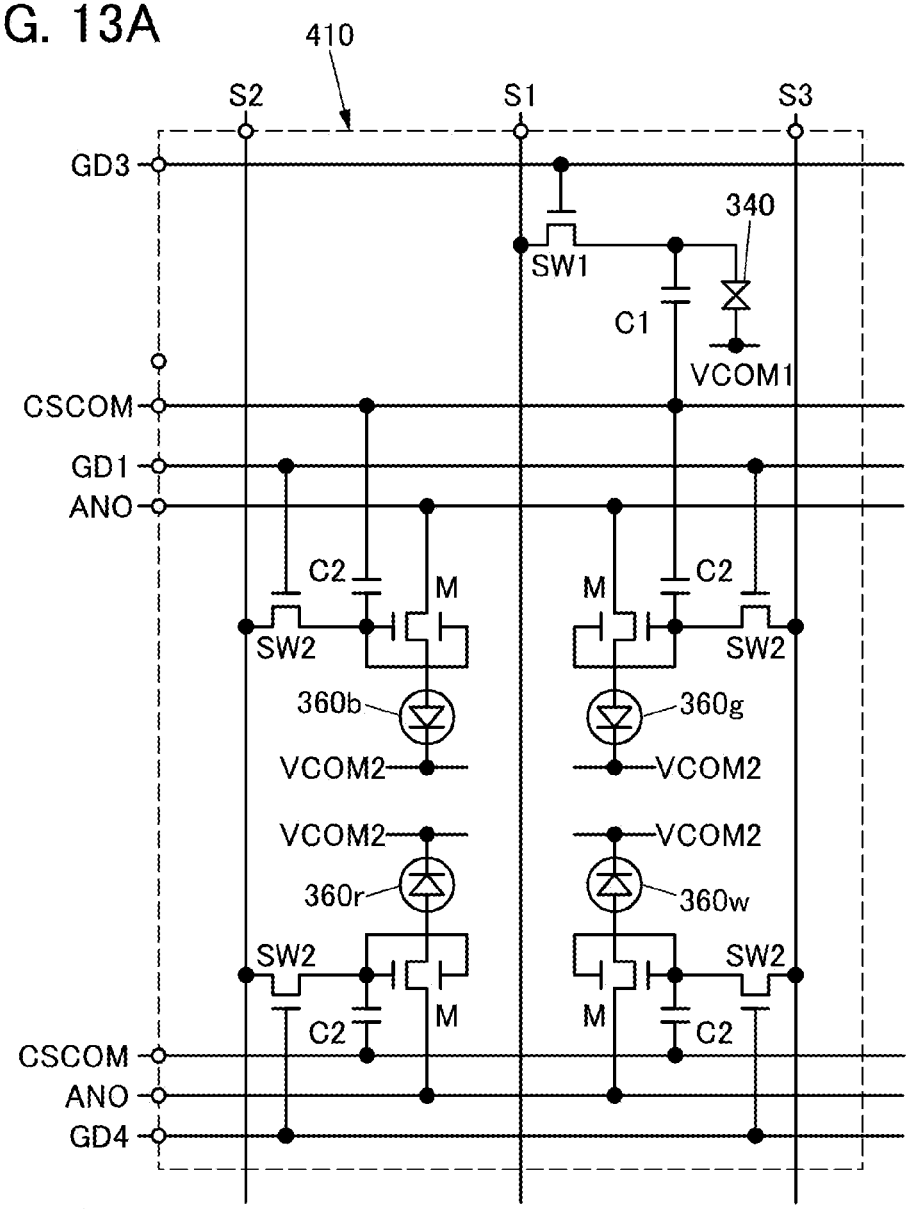
FIGS. 13A and 13B are a view illustrating a circuit of a display device and a top view of a pixel, respectively.

Note that one embodiment of the present invention is not limited to the example shown in FIG. 12, in which one pixel 410 includes one liquid crystal element 340 and one light-emitting element 360. FIG. 13A shows an example in which one pixel 410 includes one liquid crystal element 340 and four light-emitting elements 360 (light-emitting elements 360*r*, 360*g*, 360*b*, and 360*w*).

In FIG. 13A, in addition to the wirings in FIG. 12, a wiring GD4 and a wiring S3 are connected to the pixel 410.

In the example shown in FIG. 13A, for example, light-emitting elements which exhibit red (R), green (G), blue (B), and white (W) can be used as the four light-emitting elements 360*r*, 360*g*, 360*b*, and 360*w*. A reflective liquid crystal element which exhibits white can be used as the liquid crystal element 340. This enables white display with high reflectance in the reflective mode. This also enables low-power display with excellent color-rendering properties in the transmissive mode.

Figure 13B:
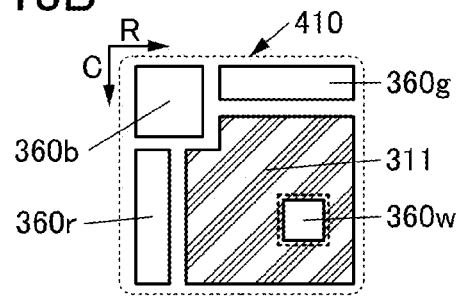

FIG. 13B shows a configuration example of the pixel 410. The pixel 410 includes the light-emitting element 360*w* which overlaps with an opening of an electrode 311 and the light-emitting elements 360*r*, 360*g*, and 360*b* which are located near the electrode 311. It is preferable that the light-emitting elements 360*r*, 360*g*, and 360*b* have substantially the same light-emitting area.

Structure Example of Display Panel

Figure 14:
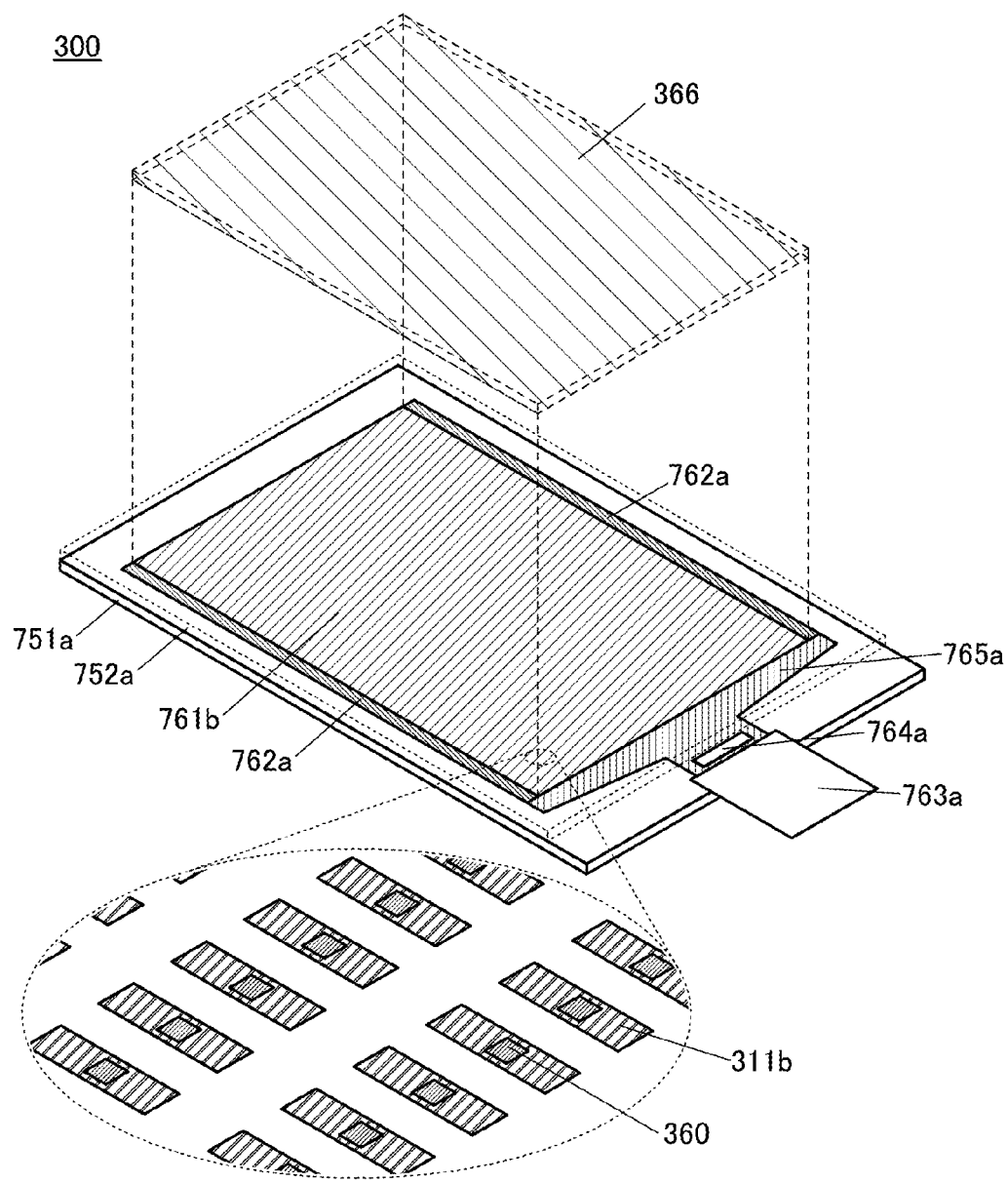
FIG. 14 illustrates a structure of a display device.

FIG. 14 is a schematic perspective view of a display device 300 of one embodiment of the present invention. The outward structure of the display device 300 is the same as that of the display device 710 illustrated in FIG. 4.

FIG. 14 shows an enlarged view of a part of the display portion 761*b*. The conductive films 311*b* included in a plurality of display elements are arranged in a matrix in the display portion 761*b*. The conductive films 311*b* each have a function of reflecting visible light and serve as a reflective electrode of the liquid crystal element 340 described later.

As illustrated in FIG. 14, the conductive film 311*b* has an opening. The light-emitting element 360 is provided on the substrate 751a side of the conductive film 311b. Light is emitted from the light-emitting element 360 to the substrate 752a side through the opening of the conductive film 311b.

Furthermore, an input device 366 can be provided over the substrate 752a. For example, a sheet-shaped capacitive touch sensor may be provided to overlap with the display portion 761b. Alternatively, a touch sensor may be provided between the substrate 752a and the substrate 751a. In the case where a touch sensor is provided between the substrate 752a and the substrate 751a, an optical touch sensor using a photoelectric conversion element as well as a capacitive touch sensor may be used.

Cross-Sectional Structure Example 1

Figure 15:
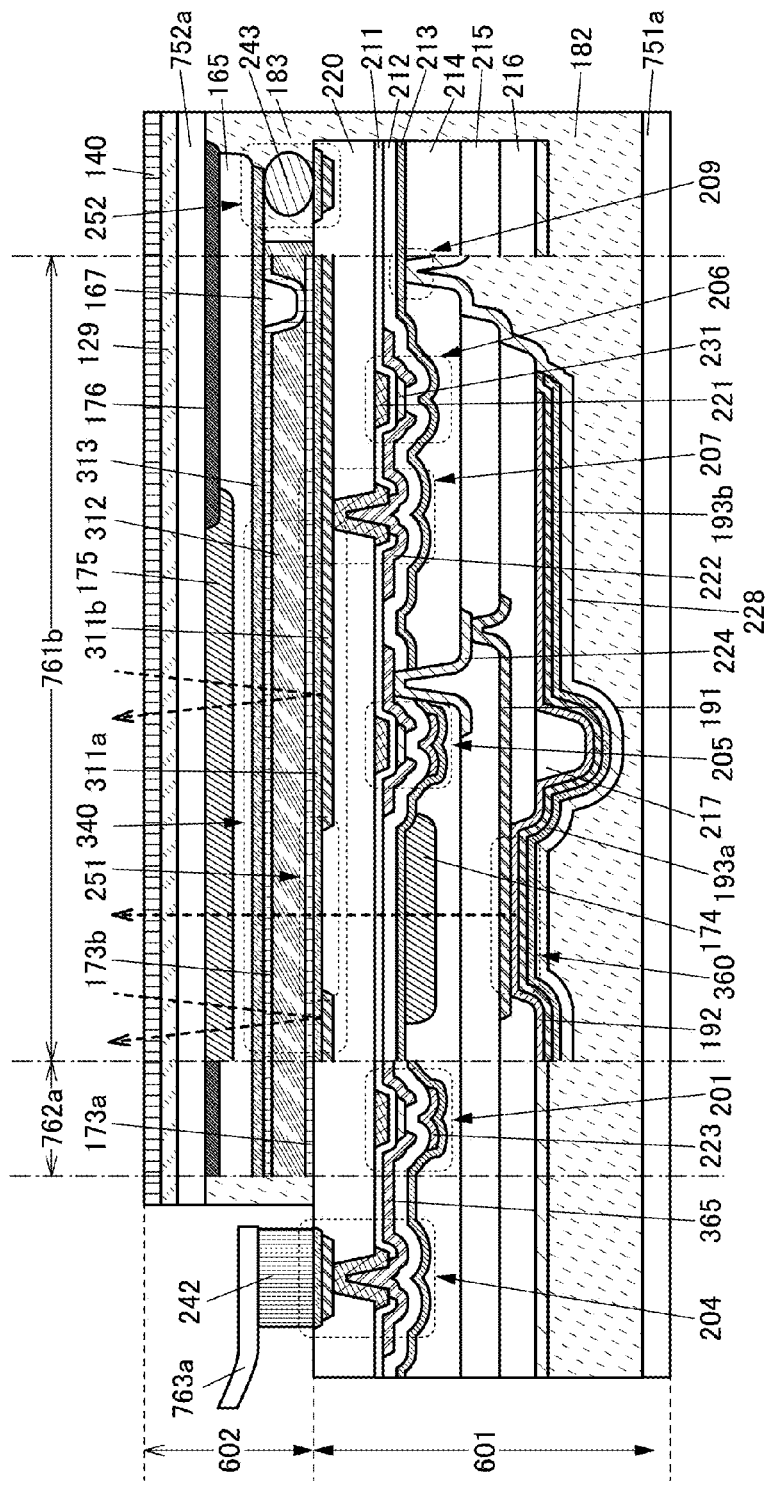
FIG. 15 illustrates a structure of a display device.

FIG. 15 illustrates an example of cross sections of part of a region including the FPC 763a, part of a region including the circuit portion 762a, and part of a region including the display portion 761b of the display device illustrated in FIG. 14.

The display device includes an insulating film 220 between the substrates 751a and 752a. The display panel also includes the light-emitting element 360, a transistor 201, a transistor 205, a transistor 206, a color film 174, and the like between the substrate 751a and the insulating film 220. Furthermore, the display panel includes the liquid crystal element 340 and a color film 175 between the insulating film 220 and the substrate 752a. The substrate 752a and the insulating film 220 are bonded with an adhesive 183. The substrate 751a and the insulating film 220 are bonded with an adhesive 182.

The transistor 206 is electrically connected to the liquid crystal element 340. The transistor 205 is electrically connected to the light-emitting element 360. Since the transistors 205 and 206 are formed on a surface on the substrate 751a side of the insulating film 220, the transistors 205 and 206 can be formed through the same process.

The substrate 752a is provided with the color film 175, a light-blocking film 176, an insulating film 165, a conductive film 313 serving as a common electrode of the liquid crystal element 340, an alignment film 173b, an insulating film 167, and the like. The insulating film 167 functions as a spacer for keeping the cell gap of the liquid crystal element 340.

Insulating films such as an insulating film 211, an insulating film 212, an insulating film 213, an insulating film 214, and an insulating film 215 are provided on the substrate 751a side of the insulating film 220. Part of the insulating film 211 functions as a gate insulating film of each transistor. The insulating film 212, the insulating film 213, and the insulating film 214 are provided to cover each transistor and the like. The insulating film 215 is provided to cover the insulating film 214. The insulating films 214 and 215 each function as a planarization film. Note that an example where the three insulating films, the insulating films 212, 213, and 214, are provided to cover the transistors and the like is described here; however, one embodiment of the present invention is not limited to this example, and four or more insulating films, a single insulating film, or two insulating films may be provided. The insulating film 214 functioning as a planarization film is not necessarily provided when not needed.

The transistors 201, 205, and 206 each include a conductive film 221 part of which functions as a gate, conductive films 222 part of which functions as a source and a drain, and a semiconductor film 231. Here, a plurality of layers obtained by processing the same conductive film are shown with the same hatching pattern.

The liquid crystal element 340 is a reflective liquid crystal element. The liquid crystal element 340 has a structure in which a conductive film 370, a liquid crystal 312, and the conductive film 313 are stacked. In addition, the conductive film 311b which reflects visible light is provided in contact with the surface on the substrate 751a side of the conductive film 370. The conductive film 311b includes an opening 251. The conductive films 370 and 313 contain a material transmitting visible light. In addition, an alignment film 173a is provided between the liquid crystal 312 and the conductive film 370 and the alignment film 173b is provided between the liquid crystal 312 and the conductive film 313.

A light diffusion plate 129 and a polarizing plate 140 are arranged on an outer surface of the substrate 752a. As the polarizing plate 140, a linear polarizing plate or a circularly polarizing plate can be used. An example of a circularly polarizing plate is a stack including a linear polarizing plate and a quarter-wave retardation plate. Such a structure can reduce reflection of external light. The light diffusion plate 129 is provided to suppress reflection of external light. The cell gap, alignment, drive voltage, and the like of the liquid crystal element used as the liquid crystal element 340 are controlled depending on the kind of the polarizing plate so that desirable contrast is obtained.

In the liquid crystal element 340, the conductive film 311b has a function of reflecting visible light, and the conductive film 313 has a function of transmitting visible light. Light entering from the substrate 752a side is polarized by the polarizing plate 140, passes through the conductive film 313 and the liquid crystal 312, and is reflected by the conductive film 311b. Then, the light passes through the liquid crystal 312 and the conductive film 313 again and reaches the polarizing plate 140. In this case, optical modulation of the light can be controlled by controlling the alignment of the liquid crystal 312 with a voltage applied between the conductive film 311b and the conductive film 313. That is, the intensity of light extracted through the polarizing plate 140 can be controlled. Light other than that in a particular wavelength region is absorbed by the color film 175, so that red light is extracted, for example.

The light-emitting element 360 is a bottom-emission light-emitting element. The light-emitting element 360 has a structure in which a conductive film 191, an EL layer 192, and a conductive film 193b are stacked in this order from the insulating film 220 side. In addition, a conductive film 193a is provided to cover the conductive film 193b. The conductive film 193b contains a material that reflects visible light, and the conductive film 191 and the conductive film 193a each contain a material that transmits visible light. Light is emitted from the light-emitting element 360 to the substrate 752a side through the color film 174, the insulating film 220, the opening 251, the conductive film 313, and the like.

A protective film 228 is provided over the conductive film 193a and an insulating film 216 included in the light-emitting element 360. As the protective film 228, the protective film 28 described in Embodiment 1 can be used. The protective film 228 provided over the light-emitting element 360 can prevent diffusion of water, oxygen, and the like from the outside to the light-emitting element 360, suppressing deterioration of the light-emitting element 360. Furthermore, a display device including a highly reliable light-emitting element can be manufactured.

In the display device illustrated in FIG. 15, the insulating film 213 and the protective film 228 are in contact with each other in a region 209. By providing the region 209 in a ring shape in a periphery of the display region, the light-emitting element 360 is located inside the region surrounded by the insulating film 213 and the protective film 228. This is preferable in preventing the diffusion of water, oxygen, and the like from the top, bottom, and side surfaces of the display device to the light-emitting element 360.

Note that although the structure in which the protective film 228 is in contact with the insulating film 213 is illustrated in FIG. 15, the protective film 228 may be in contact with the insulating film 211 or the insulating film 212.

Here, as illustrated in FIG. 15, the opening 251 is preferably provided with the conductive film 370 which transmits visible light. Accordingly, the liquid crystal 312 is aligned in a region overlapping with the opening 251 as well as in the other region; therefore, an alignment defect of the liquid crystal in a boundary portion between these regions, which might cause undesired light leakage, can be suppressed.

An insulating film 217 is provided over the insulating film 216 which covers an end portion of the conductive film 191. The insulating film 217 functions as a spacer that prevents the substrate 751a from being unnecessarily close to the insulating film 220. In addition, in the case where the EL layer 192 or the conductive film 193a is formed using a blocking mask (metal mask), the insulating film 217 may have a function of preventing the blocking mask from being in contact with a surface on which the EL layer 192 or the conductive film 193a is to be formed. Note that the insulating film 217 is not necessarily provided.

One of a source and a drain of the transistor 205 is electrically connected to the conductive film 191 of the light-emitting element 360 through a conductive film 224.

One of a source and a drain of the transistor 206 is electrically connected to the conductive film 311b through a connection portion 207. The conductive film 311b and the conductive film 370 are in contact with and electrically connected to each other. In the connection portion 207, the conductive films provided on both surfaces of the insulating film 220 are connected to each other through an opening of the insulating film 220.

A connection portion 204 is provided in a region in which the substrate 751a and the substrate 752a do not overlap with each other. The connection portion 204 is electrically connected to the FPC 763a through a connector 242. The connection portion 204 has a structure similar to that of the connection portion 207. On a top surface of the connection portion 204, a conductive film obtained by processing the same conductive film as the conductive film 370 is exposed. Thus, the connection portion 204 and the FPC 763a can be electrically connected to each other through the connector 242.

A connection portion 252 is provided in a part of a region in which the adhesive 183 is provided. In the connection portion 252, a conductive film obtained by processing the same conductive film as the conductive film 370 is electrically connected to a part of the conductive film 313 through a connector 243. Accordingly, a signal or a potential input from the FPC 763a connected on the substrate 751a side can be supplied to the conductive film 313 formed on the substrate 752a side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 243, a material capable of elastic deformation or plastic deformation is preferably used. As illustrated in FIG. 15, the connector 243 which is a conductive particle has a vertically pressed shape in some cases. Accordingly, the contact area between the connector 243 and a conductive film electrically connected to the connector 243 is increased, so that contact resistance can be reduced and problems such as disconnection can be suppressed.

The connector 243 is preferably provided so as to be covered with the adhesive 183. For example, the connector 243 may be dispersed in the adhesive 183 which is not cured yet.

FIG. 15 illustrates an example of the circuit portion 762a in which the transistor 201 is provided.

The structure in which the semiconductor film 231 where a channel is formed is provided between two gates is used as an example of the transistors 201 and 205 in FIG. 15. One gate is formed using the conductive film 221 and the other gate is formed using a conductive film 223 overlapping with the semiconductor film 231 with the insulating film 212 provided therebetween. Such a structure enables control of the threshold voltage of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of an increase in size or resolution.

Note that the transistor included in the circuit portion 762a and the transistor included in the display portion 761b may have the same structure. A plurality of transistors included in the circuit portion 762a may have the same structure or different structures. A plurality of transistors included in the display portion 761b may have the same structure or different structures.

A material through which impurities such as water or hydrogen do not easily diffuse is preferably used for at least one of the insulating film 212 and the insulating film 213 that cover the transistors. That is, the insulating film 212 or the insulating film 213 can function as a barrier film. Such a structure can effectively suppress diffusion of impurities into the transistors from the outside, and a highly reliable display device can be achieved.

The insulating film 165 is provided on the substrate 752a side so as to cover the color film 175 and the light-blocking film 176. The insulating film 165 may have a function of a planarization film. The insulating film 165 enables the conductive film 313 to have an almost flat surface, resulting in a uniform alignment state of the liquid crystal 312.

Cross-Sectional Structure Example 2

Figure 16:
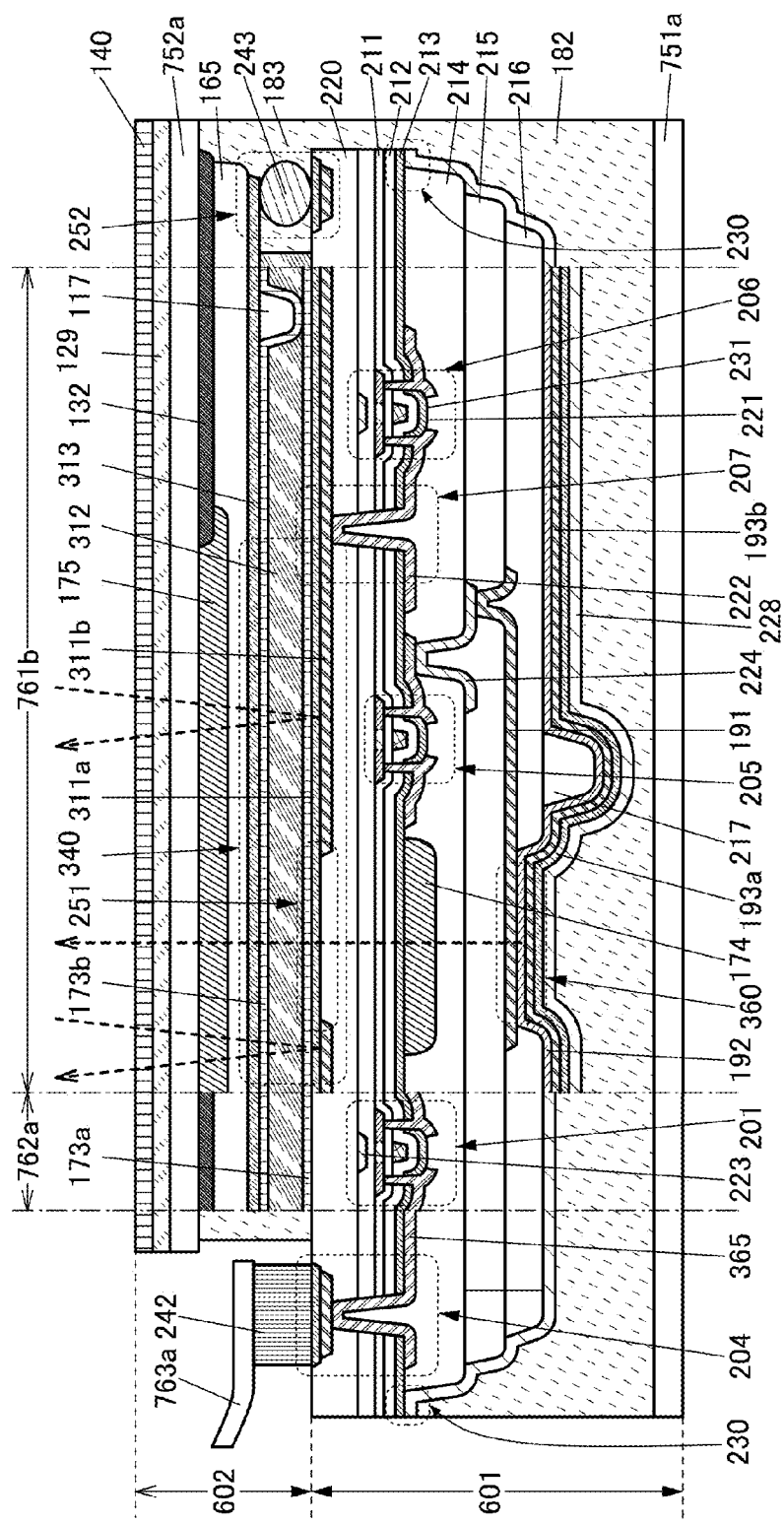
FIG. 16 illustrates a structure of a display device.

FIG. 16 illustrates an example of a display device in which a top-gate transistor is used as each transistor in the structure illustrated in FIG. 15. The use of a top-gate transistor can reduce parasitic capacitance, leading to an increase in the frame frequency of display.

The transistor included in the display device of one embodiment of the present invention includes a conductive film functioning as the gate electrode, the semiconductor film, a conductive film functioning as the source electrode, a conductive film functioning as the drain electrode, and an insulating film functioning as the gate insulating film.

Note that there is no particular limitation on the structure of the transistor. For example, a planar transistor, a staggered transistor, or an inverted staggered transistor may be used. A top-gate transistor or a bottom-gate transistor may be used. Furthermore, gate electrodes may be provided above and below a channel.

The protective film 228 is provided over the conductive film 193a included in the light-emitting element 360 and over the insulating film 216. The protective film 228 is in contact with the insulating film 213 in a region 230. By providing the region 230 in a ring shape in a periphery of the display region, the light-emitting element 360 is located inside the region surrounded by the insulating film 213 and the protective film 228. This is preferable in preventing the diffusion of water, oxygen, and the like from the top, bottom, and side surfaces of the display device to the light-emitting element 360.

Note that although the structure in which the protective film 228 is in contact with the insulating film 213 is illustrated in FIG. 16, the protective film 228 may be in contact with the insulating film 211 or the insulating film 212.

Note that as the components in the display device described in this embodiment, the components of the display device described in Embodiment 3 can be used as appropriate.

At least part of this embodiment can be implemented in combination with any of the other embodiments described in this specification as appropriate.

Embodiment 5

In this embodiment, a display module that can be manufactured using one embodiment of the present invention will be described.

Figure 17:
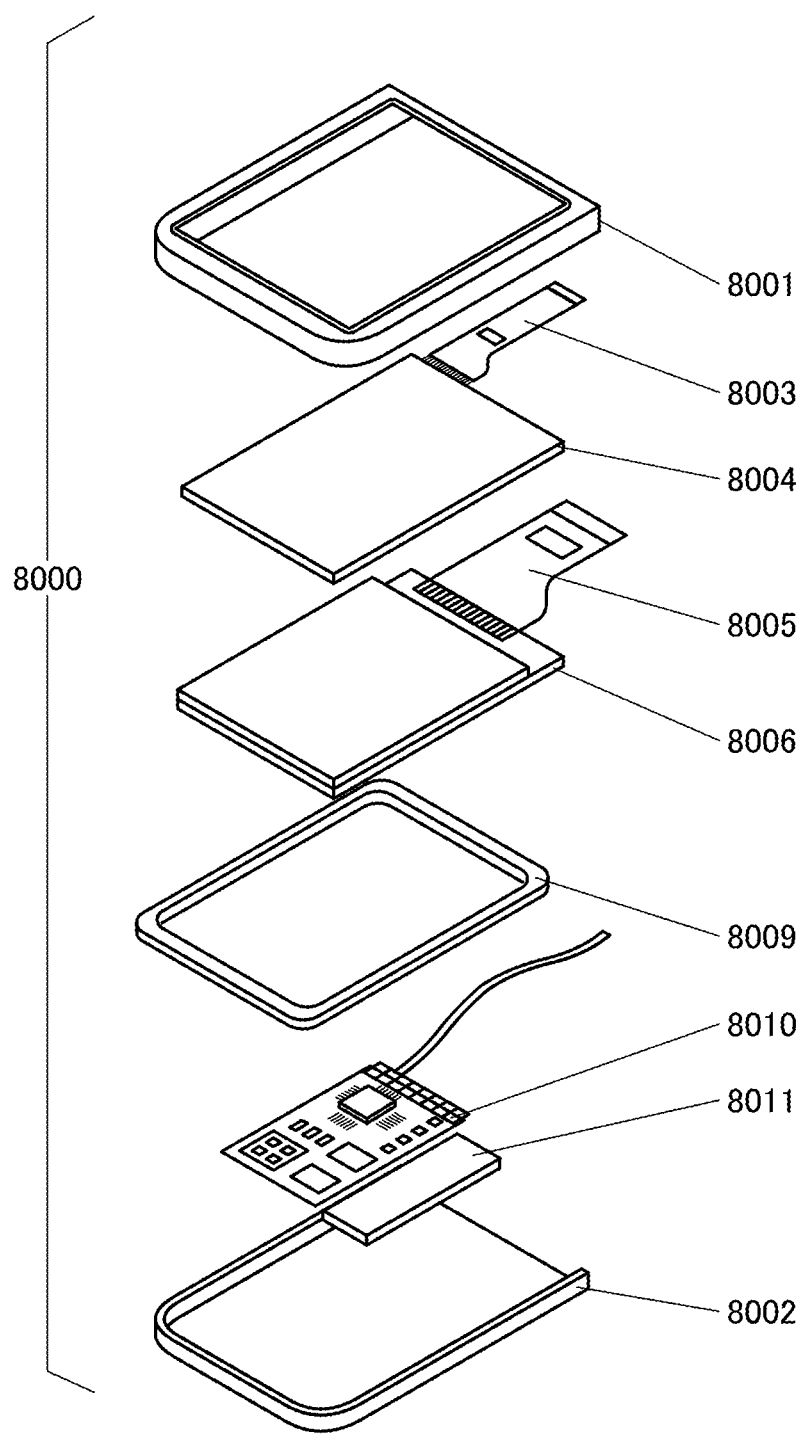
FIG. 17 illustrates a structural example of a display module according to one embodiment.

In a display module 8000 in FIG. 17, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device manufactured using one embodiment of the present invention can be used for, for example, the display panel 8006. For example, by using the display device manufactured using one embodiment of the present invention for the display panel 8006, the high-definition display module 8000 can be manufactured. Furthermore, the reliability of the display module can be increased.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may overlap with the display panel 8006. Instead of providing the touch panel 8004, the display panel 8006 can be made to have a touch panel function.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

At least part of this embodiment can be implemented in appropriate combination with any of the other embodiments described in this specification.

Embodiment 6

In this embodiment, electronic devices to which the display device of one embodiment of the present invention can be applied will be described.

The display device of one embodiment of the present invention can be used for a display portion of an electronic device. As a result, the electronic device can have high display quality, extremely high resolution, or high reliability.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-metal hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of embodiments of the present invention are not limited thereto, and the electronic devices can have a variety of functions.

The display device of one embodiment of the present invention can display images with extremely high resolution. For this reason, the display device can be used particularly for portable electronic devices, wearable electronic devices (wearable devices), e-book readers, and the like. In addition, the display device can be suitably used for virtual reality (VR) devices, augmented reality (AR) devices, and the like.

Figure 18A:
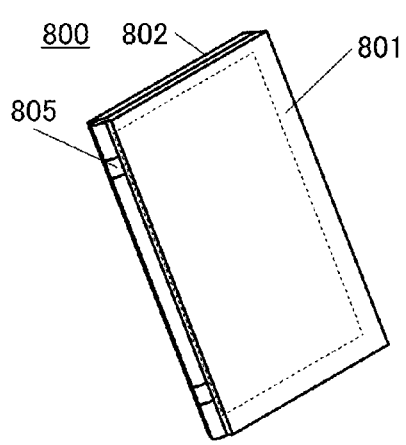
FIGS. 18A to 18D each illustrate an electronic device according to one embodiment.
Figure 18B:
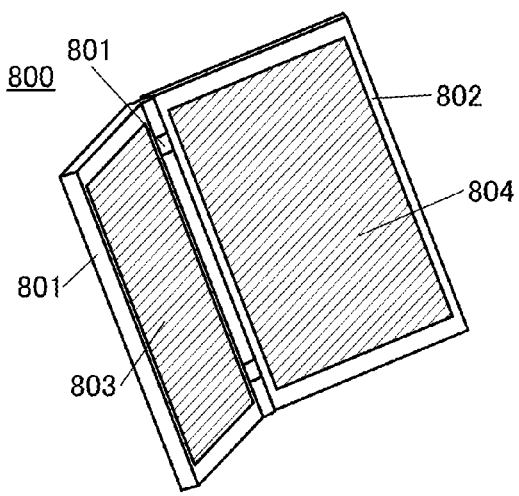

FIGS. 18A and 18B illustrate an example of a portable information terminal 800. The portable information terminal 800 includes a housing 801, a housing 802, a display portion 803, a display portion 804, and a hinge portion 805, for example.

The housing 801 and the housing 802 are connected with the hinge portion 805. The portable information terminal 800 folded as in FIG. 18A can be changed into the state illustrated in FIG. 18B, in which the housing 801 and the housing 802 are opened.

For example, the portable information terminal 800 can also be used as an e-book reader, in which the display portion 803 and the display portion 804 can each display text data. In addition, the display portion 803 and the display portion 804 can each display a still image or a moving image.

In this manner, the portable information terminal 800 has high versatility because it can be folded when carried.

Note that the housing 801 and the housing 802 may include a power switch, an operation button, an external connection port, a speaker, a microphone, and/or the like.

Figure 18C:
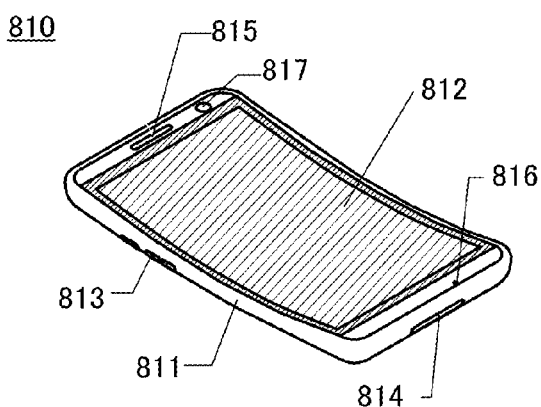

FIG. 18C illustrates an example of a portable information terminal. A portable information terminal 810 illustrated in FIG. 18C includes a housing 811, a display portion 812, operation buttons 813, an external connection port 814, a speaker 815, a microphone 816, a camera 817, and the like.

The display portion 812 is provided with the display device of one embodiment of the present invention. When the display device manufactured using one embodiment of the present invention is used in the display portion 812, even when the area of the display portion 812 is small, an obtained image in high definition can be seen.

The portable information terminal 810 includes a touch sensor in the display portion 812. Operations such as making a call and inputting a letter can be performed by touch on the display portion 812 with a finger, a stylus, or the like.

With the operation buttons 813, power on/off can be switched and types of images displayed on the display portion 812 can be switched. For example, images can be switched from a mail creation screen to a main menu screen.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). The direction of display on the screen can also be changed by touch on the display portion 812, operation with the operation buttons 813, sound input using the microphone 816, or the like.

The portable information terminal 810 has one or more of a telephone function, a notebook function, an information browsing function, and the like. Specifically, the portable information terminal 810 can be used as a smartphone. The portable information terminal 810 is capable of executing a variety of applications such as mobile phone calls, e-mailing, viewing and editing texts, music reproduction, video replay, Internet communication, and games.

Figure 18D:
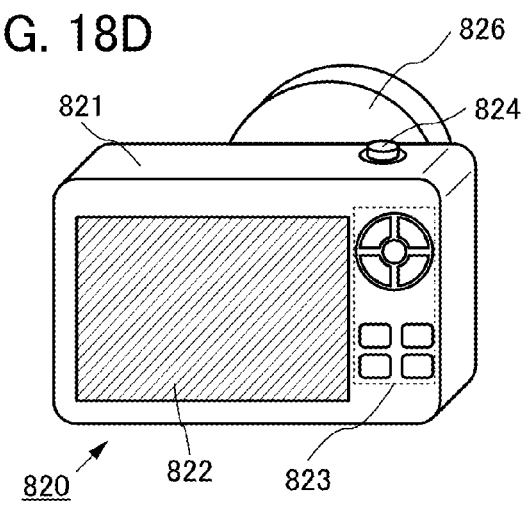

FIG. 18D illustrates an example of a camera. A camera 820 includes a housing 821, a display portion 822, operation buttons 823, a shutter button 824, and the like. The camera 820 is provided with an attachable lens 826.

The display portion 822 is provided with the display device of one embodiment of the present invention.

Although the lens 826 of the camera 820 here is detachable from the housing 821 for replacement, the lens 826 may be integrated with the housing 821.

Still images or moving images can be taken with the camera 820 by pushing the shutter button 824. In addition, images can be taken by a touch on the display portion 822 that serves as a touch panel.

Note that a stroboscope, a viewfinder, or the like can be additionally provided in the camera 820. Alternatively, these can be incorporated in the housing 821.

Figure 19A:
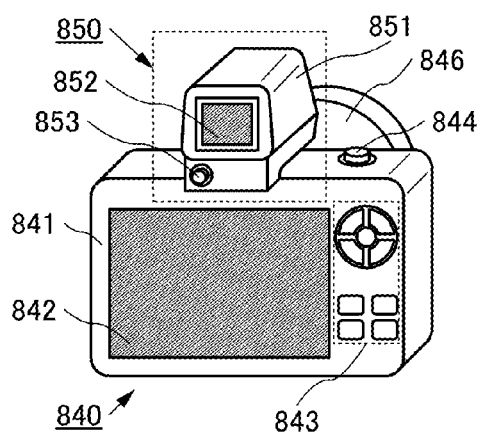
FIGS. 19A to 19E each illustrate an electronic device according to one embodiment.

FIG. 19A is an external view of a camera 840 to which a finder 850 is attached.

The camera 840 includes a housing 841, a display portion 842, an operation button 843, a shutter button 844, and the like. Furthermore, an attachable lens 846 is attached to the camera 840.

Although the lens 846 of the camera 840 here is detachable from the housing 841 for replacement, the lens 846 may be built in a housing.

When the shutter button 844 is pressed, the camera 840 can take images. In addition, the display portion 842 has a function of a touch panel, and images can be taken when the display portion 842 is touched.

The housing 841 of the camera 840 has a mount including an electrode, and the finder 850, a stroboscope, and the like can be connected.

The finder 850 includes a housing 851, a display portion 852, a button 853, and the like.

The housing 851 includes a mount for engagement with the mount of the camera 840 so that the finder 850 can be connected to the camera 840. The mount includes an electrode, and a moving image or the like received from the camera 840 through the electrode can be displayed on the display portion 852.

The button 853 serves as a power button. The display portion 852 can be turned on and off using the button 853.

The display device of one embodiment of the present invention can be used in the display portion 842 of the camera 840 and the display portion 852 of the finder 850. When the display device of one embodiment of the present invention is used in the display portions 842 and 852, even when the area of the display portions 842 and 852 is small, an obtained image in high definition can be seen.

Although the camera 840 and the finder 850 are separate and detachable electronic devices in FIG. 19A, a finder including the display device of one embodiment of the present invention may be built in the housing 841 of the camera 840.

Figure 19B:
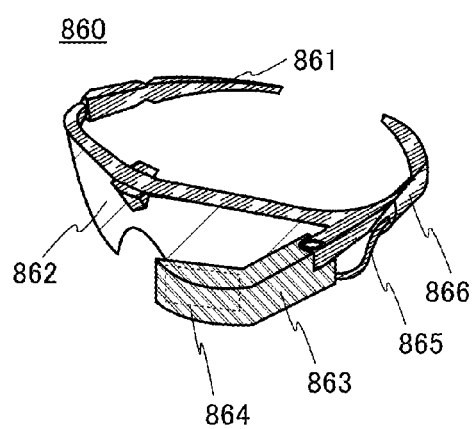

FIG. 19B is an external view of a head-mounted display 860.

The head-mounted display 860 includes a mounting portion 861, a lens 862, a main body 863, a display portion 864, a cable 865, and the like. In addition, a battery 866 is built in the mounting portion 861.

Power is supplied from the battery 866 to the main body 863 through the cable 865. The main body 863 includes a wireless receiver or the like to receive video data such as image data and display it on the display portion 864. The movement of the user's eyeball or eyelid is captured by a camera in the main body 863 and then the coordinates of the eyepoint are calculated using the captured data to utilize the user's eye as an input means.

A plurality of electrodes may be provided in a portion of the mounting portion 861 a user touches. The main body 863 may have a function of sensing a current flowing through the electrodes with the movement of the user's eyeball to determine the location of the eyepoint. The main body 863 may have a function of sensing a current flowing through the electrodes to monitor the user's pulse. The mounting portion 861 may include sensors such as a temperature sensor, a pressure sensor, or an acceleration sensor so that the user's biological information can be displayed on the display portion 864. The main body 863 may sense the movement of the user's head or the like to move an image displayed on the display portion 864 in synchronization with the movement of the user's head, or the like.

The display device of one embodiment of the present invention can be used in the display portion 864. By using the display device of one embodiment of the present invention in the display portion 864, a realistic image can be displayed.

Figure 19C:
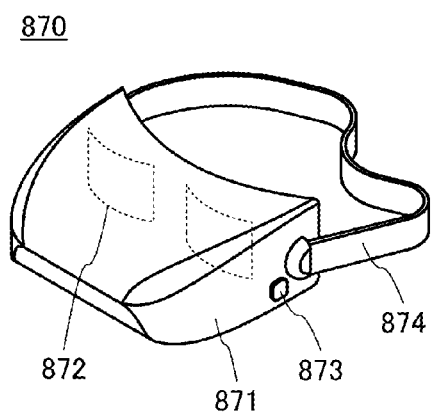
Figure 19D:
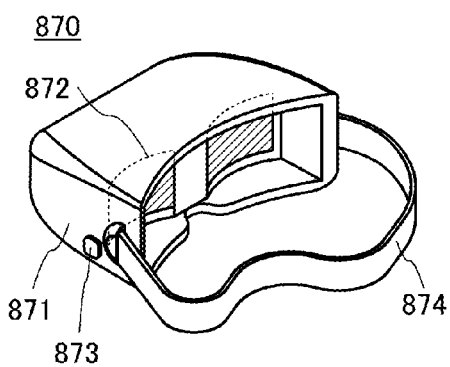

FIGS. 19C and 19D are external views of a head-mounted display 870.

The head-mounted display 870 includes a housing 871, two display portions 872, an operation button 873, and a fixing band 874.

The head-mounted display 870 has the functions of the above-described head-mounted display 860 and includes two display portions.

Since the head-mounted display 870 includes the two display portions 872, the user's eyes can see their respective display portions. Thus, a high-definition image can be displayed even when a three-dimensional display using parallax, or the like, is performed. In addition, the display portion 872 is curved around an arc with the user's eye as an approximate center. Owing to this, the distance between the user's eye and the display surface of the display portion is uniform; thus, the user can see a more natural image. Even when the luminance or chromaticity of light emitted from the display portion varies depending on the user' viewing angle, the influence of the variation can be substantially ignorable and thus a more realistic image can be displayed because the user's eye is positioned in the normal direction of the display surface of the display portion.

The operation button 873 serves as a power button or the like. A button other than the operation button 873 may be included.

Figure 19E:
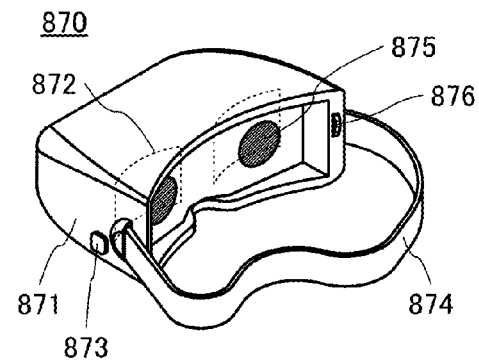

As illustrated in FIG. 19E, lenses 875 may be provided between the display portion 872 and the user's eyes. The user can see magnified images on the display portion 872 through the lenses 875, leading to higher sense of presence. In that case, as illustrated in FIG. 19E, a dial 876 for changing the position of the lenses and adjusting visibility may be included.

The display device of one embodiment of the present invention can be used for the display portion 872. Since the display device of one embodiment of the present invention has extremely high definition, even when an image is magnified using the lenses 875 as illustrated in FIG. 19E, the pixels are not perceived by the user, and thus a more realistic image can be displayed.

Figure 20A:
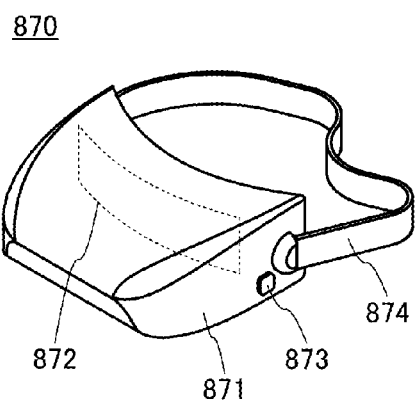
FIGS. 20A to 20D each illustrate an electronic device according to one embodiment.
Figure 20B:
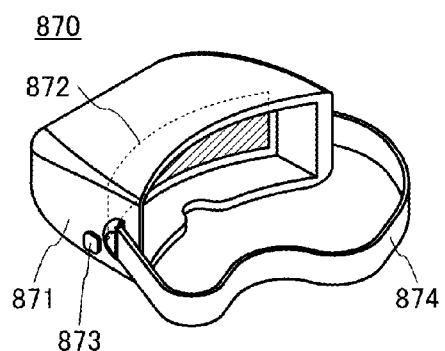

FIGS. 20A and 20B illustrate an example in which the head-mounted display includes one display portion 872. This structure can reduce the number of components.

The display portion 872 can display an image for the right eye and an image for the left eye side by side on a right region and a left region, respectively. Thus, a three-dimensional moving image using binocular disparity can be displayed.

One image which can be seen by both eyes may be displayed on the entire display portion 872. A panorama moving image can thus be displayed from end to end of the field of view; thus, the sense of reality is increased.

The lenses 875 may be provided. Two images may be displayed side by side on the display portion 872. Alternatively, one image may be displayed on the display portion 872 and seen by both eyes through the lenses 875.

Figure 20C:
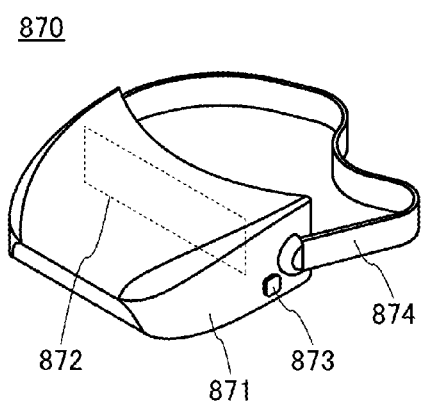
Figure 20D:
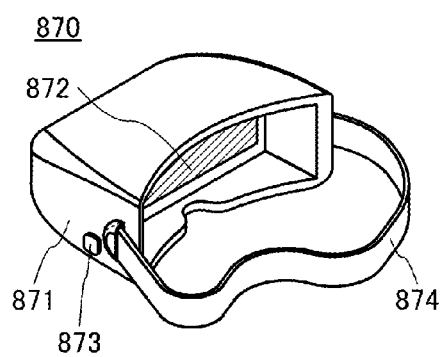

The display portion 872 is not necessarily curved and may have a flat display surface as shown in an example of FIGS. 20C and 20D in which the display portion 872 does not have a curved surface, for example.

At least part of this embodiment can be implemented in combination with any of the other embodiments described in this specification as appropriate.

Example 1

In this example, the film density of aluminum oxide films formed by a sputtering method or an ALD method is described.

<Samples S1 and S2>

Aluminum oxide films each with a thickness of 500 nm were formed over a glass substrate by a sputtering method. The film deposition conditions are shown in Table 1. Note that the aluminum oxide films were formed by a reactive sputtering method using aluminum as a sputtering target and a mixed gas including oxygen as a sputtering gas.

TABLE 1

| Sample | S1 | S2 |
| --- | --- | --- |
| Method | Sputtering method | |
| Type | Facing target type | |
| Power output (kW) | 1.2–1.3 | |
| Deposition pressure (Pa) | 0.5 | 0.3 |
| Ar flow rate (sccm) | 50 | |
| $O_2$ flow rate (sccm) | 8 | |
| $N_2$ flow rate (sccm) | 0 | |
| Substrate temperature | heat treatment not performed | |

<Samples A1 to A3>

Aluminum oxide films with a thickness of 100 nm or 50 nm were formed over a glass substrate by an ALD method. The thickness of the aluminum oxide film of Sample A1 is 100 nm. The thickness of each of the aluminum oxide films of Samples A2 and A3 is 50 nm. The time of one cycle of Samples A1 and A2 is different from that of Sample A3. Furthermore, the deposition time differs among Samples A1, A2, and A3. The film deposition conditions are shown in Table 2. Note that one cycle is a period of time taken for replacing each gas of the precursor and the oxidizer. The longer the time of one cycle is, the less the unreacted precursor remains in a deposition chamber.

TABLE 2

| Sample | A1 | A2 | A3 |
|---|---|---|---|
| Method | ALD method | | |
| Oxidizer | $O_3$ | | |
| Precursor | trimethylaluminum ($Al(CH_3)_3$) | | |
| Preheat treatment time (hours) | 2 | | |
| Substrate temperature (° C.) | Approx. 100 | | |
| $O_3$ generation time (hours) | 0.1 | | |
| One cycle time (seconds) | | 16.4 | 38.4 |
| Deposition time (hours) | 4.7 | 2.1 | 4.8 |

The measured film densities of the aluminum oxide films in Samples S1, S2, and A1 to A3 are shown in Table 3. Here, the film densities were measured by X-ray reflectometry with TRXV-SMX manufactured by TECHNOS JAPAN CORP. The film density measurement was performed on the films except for interface layers at bottom and top surfaces of the films.

TABLE 3

| | Sample S1 | Sample S2 | Sample A1 | Sample A2 | Sample A3 |
|---|---|---|---|---|---|
| Film density (g/cm$^3$) | 2.69 | 2.89 | 2.54 | 2.54 | 2.7 |

From Table 3, it can be found that the aluminum oxide film formed by an ALD method can have a higher film density when the deposition time of one cycle is prolonged because impurities included in the film can be reduced. Moreover, by using a sputtering method, a reduction of impurities included in the film is possible.

Example 2

In this example, measured quantitative values of elements included in the aluminum oxide films formed in Example 1 are described.

The quantitative values of aluminum, oxygen, and carbon included in the films of Samples S1, S2, A1, and A2 were measured by X-ray photoelectron spectroscopy. The measurement results are shown in Table 4. In the XPS of this example, Quantera SXM manufactured by ULVAC-PHI Inc. was used as a measurement apparatus, where monochromatic AlKα ray (1.486 keV) was used as an X-ray source.

TABLE 4

| | Al (atomic %) | O (atomic %) | C (atomic %) | O/Al |
|---|---|---|---|---|
| Sample S1 | 40.3 | 59.7 | 0.0 | 1.5 |
| Sample S2 | 41.0 | 59.0 | 0.0 | 1.4 |
| Sample A1 | 34.3 | 63.0 | 2.8 | 1.84 |
| Sample A2 | 34.3 | 63.0 | 2.8 | 1.84 |

As shown in Table 4, aluminum and oxygen were detected from the aluminum oxide films formed by a sputtering method. Furthermore, the aluminum oxide films formed by an ALD method include aluminum, oxygen, and a small amount of carbon. The reason for the inclusion of carbon is considered as follows: trimethylaluminum is used as the precursor, which is a source material in the formation of the aluminum oxide films, and some of the methyl groups are not oxidized and remain in the aluminum oxide films.

Table 4 also shows that the aluminum oxide films formed by an ALD method have a higher atomic ratio of oxygen to aluminum (O/Al) than the aluminum oxide films formed by a sputtering method. In other words, the aluminum oxide films formed by a sputtering method and the aluminum oxide films formed by an ALD method have different compositions from each other.

Therefore, when an aluminum oxide film formed by a sputtering method and an aluminum oxide film formed by an ALD method are stacked in this order to form a protective film, the upper aluminum oxide film has a higher carbon content and a higher atomic ratio of oxygen to aluminum (O/Al) than the lower aluminum oxide film in the protective film. The ratio of oxygen to aluminum of the aluminum oxide film formed by a sputtering method is close to the stoichiometric composition ($Al_2O_3$).

Example 3

In this example, optical characteristics of the aluminum oxide film formed by a sputtering method are described.

A manufacturing method of a sample is described first. Here, a 500-nm-thick aluminum oxide film was formed under conditions similar to those of Sample S1 in Example 1, that is, by a sputtering method.

Figure 21A:
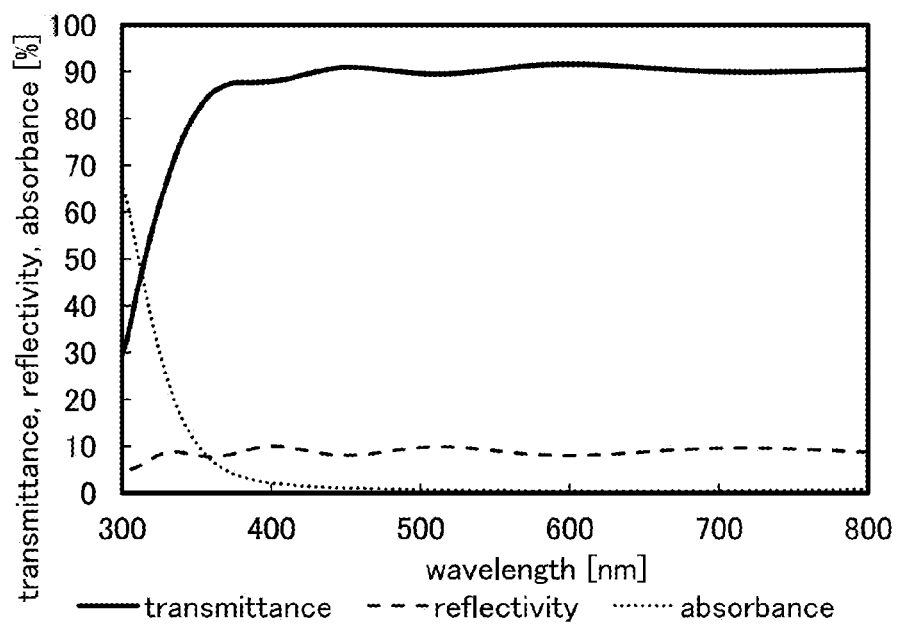
FIGS. 21A and 21B show transmittance, reflectivity, and absorbance of a sample.

FIG. 21A shows the transmittance, reflectivity, and absorbance of the sample. In FIG. 21A, the horizontal axis shows the wavelength and the vertical axis shows the transmittance, reflectivity, and absorbance of light. A solid line, a broken line, and a dotted line indicate transmittance, reflectivity, and absorptance, respectively. As shown in FIG. 21A, the transmittance of the sample is high.

Figure 21B:
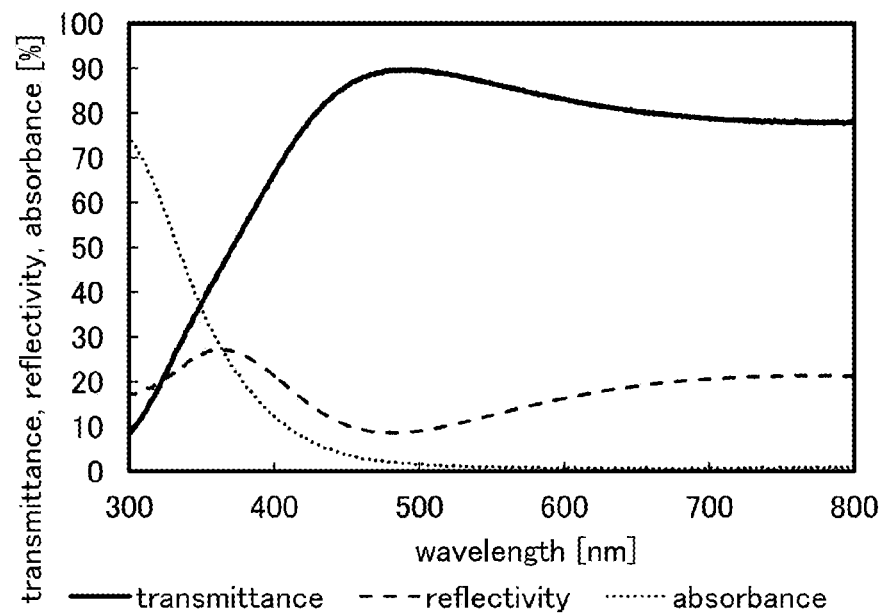

For reference, optical characteristics of an ITO film with a thickness of 70 nm formed over a glass substrate by a sputtering method are shown in FIG. 21B.

The transmittance of the aluminum oxide film in FIG. 21A is higher than that of the ITO film shown in FIG. 21B. Accordingly, even when an aluminum oxide film is formed over a light-emitting element by a sputtering method, extraction efficiency of light emitted from the light-emitting element is not disturbed.

Example 4

In this example, cross-sectional shapes of protective films were observed by scanning transmission electron microscopy (STEM).

A manufacturing method of a sample is described first. As illustrated in FIGS. 1A and 1B, the first electrode 10 was formed over the substrate 40. Here, a glass substrate was used as the substrate 40. A 100-nm-thick Ag—Pd—Cu alloy film and a 95-nm-thick ITO film were stacked to form the first electrode 10.

Next, the insulating film 14 was formed over the first electrode 10. Here, a 1000-nm-thick polyimide film was formed as the insulating film 14.

Then, the EL layer 16 with a thickness of 200 nm was formed over the first electrode 10 and the insulating film 14.

Next, the second electrode 18 was formed over the EL layer 16. Here, a 15-nm-thick Ag—Mg alloy film and a 70-nm-thick ITO film were stacked to form the second electrode 18.

Next, the insulating film 24 was formed over the second electrode 18, and the insulating film 26 was formed over the insulating film 24. Here, after a 300-nm-thick aluminum oxide film was formed by a sputtering method as the insulating film 24, a 50-nm-thick aluminum oxide film was formed by an ALD method as the insulating film 26.

Next, as a protective film used for STEM observation, a carbon film C and a platinum film Pt were formed in a stacked manner over the insulating film 26.

A cross section of the sample was observed by STEM. The observation result is shown in FIG. 22A.

Furthermore, as a comparative example, a comparative sample which is not provided with the insulating film 26 over the insulating film 24 was formed. Here, as the insulating film 24, a 1000-nm-thick aluminum oxide film was formed by a sputtering method.

A cross section of the comparative sample was observed by STEM. The observation result is shown in FIG. 22B.

Figure 22A:
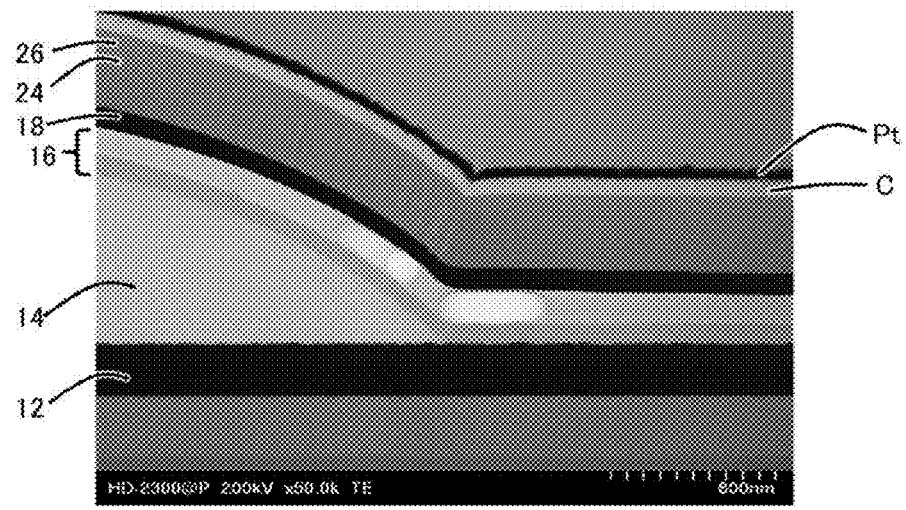
FIGS. 22A and 22B are STEM images.
Figure 22B:
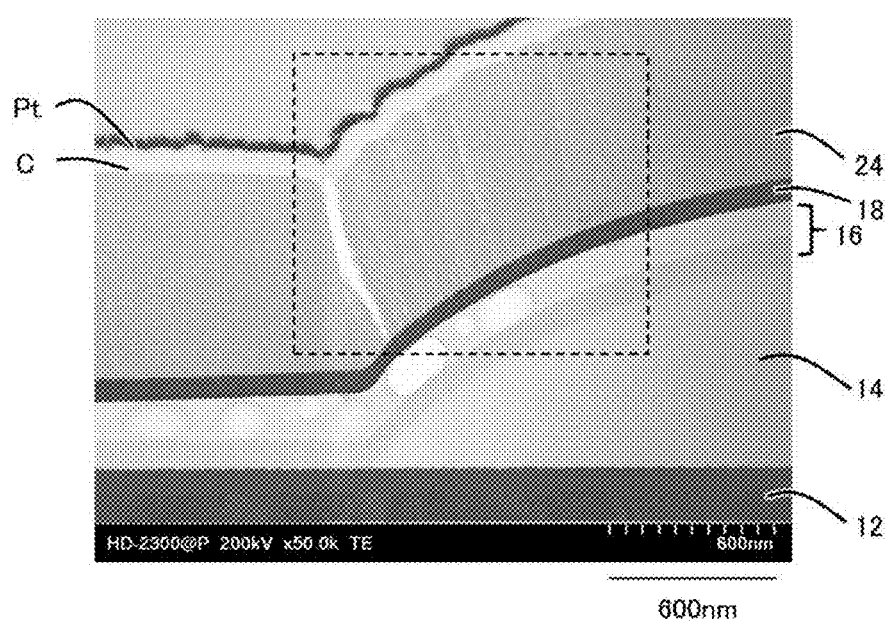

FIGS. 22A and 22B are STEM images. Note that in FIGS. 22A and 22B, a defect region and a low-density region are shown with lower contrast than a high-density region. In FIG. 22B, many linear-shaped low-density regions are observed in a region of the insulating film 24 (indicated by a dotted rectangle) which overlaps with a region of the insulating film 14 having a surface oblique to a surface of the substrate.

In contrast, as shown in FIG. 22A, where the insulating film 26 is formed over the insulating film 24, linear-shaped low-density regions are not observed in the insulating film 24 overlapping with the region of the insulating film 14 having the surface oblique to the surface of the substrate.

From FIGS. 22A and 22B, it can be found that formation of an aluminum oxide film by an ALD method over an aluminum oxide film formed by a sputtering method reduces low-density regions in the aluminum oxide film formed by a sputtering method. One possible reason for the reduction of the low-density region is that the low-density regions are filled with the aluminum oxide formed by an ALD method.

Example 5

In this example, moisture permeabilities of the aluminum oxide films included in the samples formed in Example 1 were evaluated with a water vapor transmission rate measurement apparatus. The evaluation results are described. Furthermore, the aluminum oxide films included in the samples formed in Example 1 were formed over light-emitting elements, and a preservation test was performed in a high-temperature high-humidity atmosphere. The test results are described.

<Water Vapor Transmission Rate>

First, a sample manufacturing process is described with reference to FIGS. 23A to 23D.

Figure 23A:
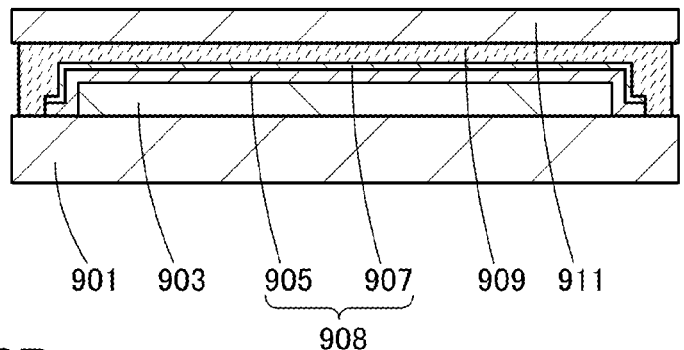
FIGS. 23A to 23D illustrate a manufacturing process of a sample.

As illustrated in FIG. 23A, an EL layer 903 was formed over a glass substrate 901. Then, an insulating film 905 was formed over the EL layer 903 by a sputtering method. Next, an insulating film 907 was formed over the insulating film 905 by an ALD method. Note that the insulating film 905 and the insulating film 907 function as a protective film 908. The insulating film 907 and a film 911 were fixed to each other with an adhesive 909.

Figure 23B:
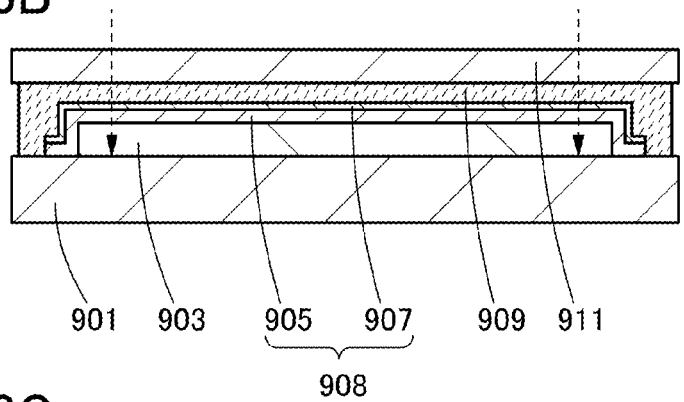

Next, as illustrated in FIG. 23B, the EL layer 903, the insulating film 905, the insulating film 907, the adhesive 909, and the film 911 were cut with a sharp cutting tool such as a knife. In FIG. 23B, dotted arrows each represent a cut.

Figure 23C:
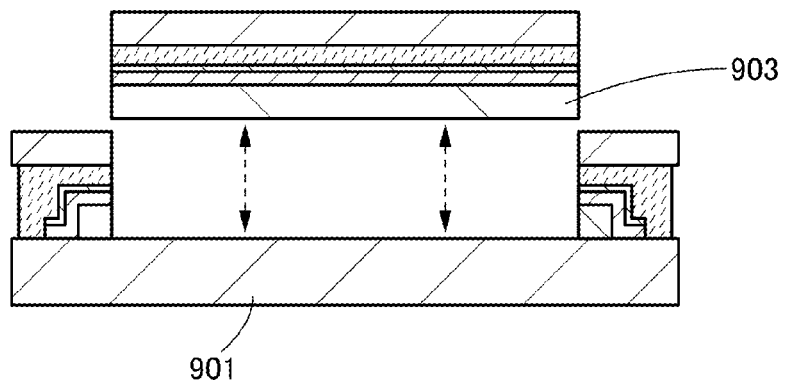

Next, as illustrated in FIG. 23C, the EL layer 903 and the glass substrate 901 were separated from each other.

Figure 23D:
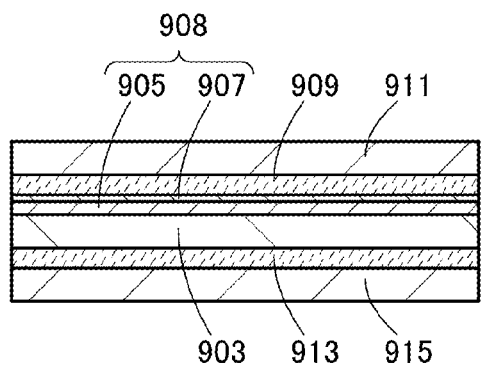

Then, as illustrated in FIG. 23D, the EL layer 903 and a film 915 were fixed to each other with an adhesive 913.

Through the above process, the samples were formed.

Here, the aluminum oxide films in the samples of Example 1 were used as the protective film 908 to form the samples.

Then, the water vapor transmission rate of each sample was measured. The measurement of the water vapor transmission rate was performed with a gas and water vapor transmission rate measuring apparatus (Super-Detect WG-7S) manufactured by MORESCO Corporation. The film 911 or the film 915 of each sample was exposed to an atmosphere of 40° C. with a humidity of 90% for several hours. The water vapor transmission rate from one of the films 911 and 915 to the other through the adhesive 913, the EL layer 903, the protective film 908, and the adhesive 909 was measured. As the moisture blocking property of the protective film 908 increases, the water vapor transmission rate decreases.

The structure of the protective film 908 and the water vapor transmission rate of each sample are shown in Table 5.

TABLE 5

| | Protective film 908 | | | | | | Water vapor transmission rate $(g/(m^2 \cdot day))$ |
|---|---|---|---|---|---|---|---|
| | Insulating film 905 | Thickness (nm) | Film density $(g/cm^3)$ | Insulating film 907 | Thickness (nm) | Film density $(g/cm^3)$ | |
| Sample S11 | Sample S1 | 500 | 2.69 | — | — | — | 1.6E−01 |
| Sample A11 | — | — | — | Sample A1 | 50 | 2.59 | 4.5E−02 |
| Sample A13 | — | — | — | Sample A3 | 50 | 2.7 | 9.5E−02 |
| Sample M11 | Sample S2 | 300 | 2.89 | Sample A2 | 50 | 2.59 | 6.3E−03 |
| Sample M12 | Sample S2 | 300 | 2.89 | Sample A3 | 50 | 2.7 | 7.3E−03 |
| Sample M13 | Sample S1 | 300 | 2.69 | Sample A3 | 50 | 2.7 | 5.2E−03 |

Table 5 shows that Sample M11 and Sample M12 have lower water vapor transmission rates than Sample S11. In other words, the water vapor transmission rate is lower when the aluminum oxide film formed by a sputtering method and the aluminum oxide film formed by an ALD method are stacked as the protective film 908 than when only a single layer of the aluminum oxide film formed by a sputtering method is used as the protective film 908. This indicates that moisture diffusion from the outside to a light-emitting element can be reduced by using a stacked film of the aluminum oxide film formed by a sputtering method and the aluminum oxide film formed by an ALD method as a protective film of the light-emitting element.

<Preservation Test Under High Temperature and High Humidity Condition>

Next, the protective films 908 included in Samples S11, M11, and M12 were formed over light-emitting elements to fabricate Samples S21, M21, and M22. The structures of the protective films in Samples S21, M21, and M22 are shown in Table 6. Note that each sample has a square shape with a side of 2 mm in a plan view.

TABLE 6

| | Protective film 908 | | | | | | Water vapor transmission rate of protective film 908 (g/(m²·day)) |
|---|---|---|---|---|---|---|---|
| | Insulating film 905 | Thickness (nm) | Film density (g/cm³) | Insulating film 907 | Thickness (nm) | Film density (g/cm³) | |
| Sample S21 | Sample S1 (sputtering method) | 500 | 2.69 | — | — | — | 1.6E−01 |
| Sample M21 | Sample S2 (sputtering method) | 300 | 2.89 | Sample A2 (ALD method) | 50 | 2.59 | 6.3E−03 |
| Sample M22 | Sample S2 (sputtering method) | 300 | 2.89 | Sample A3 (ALD method) | 50 | 2.7 | 7.3E−03 |

Then, Samples S21, M21, and M22 were preserved in an atmosphere with a temperature of 65° C. and a humidity of 95%. The preservation time of Sample S21 was 0 hours, and those of Samples M21 and M22 were 500 hours.

Figure 24A:
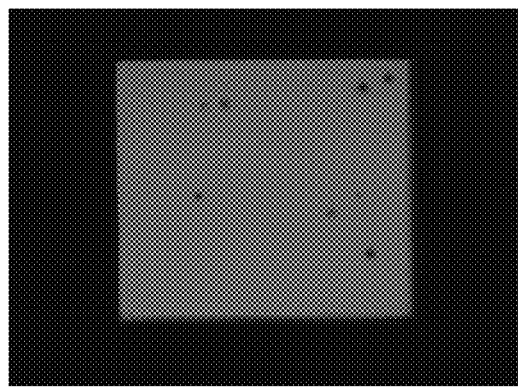
FIGS. 24A to 24C are optical micrographs of samples.
Figure 24B:
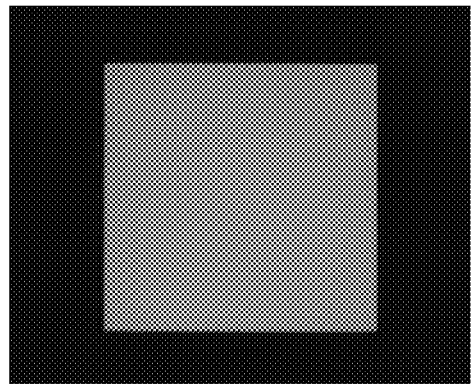
Figure 24C:
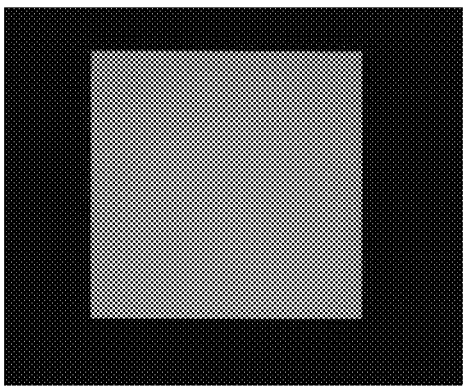

FIGS. 24A to 24C are optical micrographs showing a state where the light-emitting elements of Samples S21, M21, and M22 emit light after the preservation test.

As shown in FIG. 24A, black spots are observed in Sample S21 in which the protective film 908 is formed of a single layer of the aluminum oxide film formed by a sputtering method. In contrast, as shown in FIGS. 24B and 24C, no black spots are observed in Samples M21 and M22 in which the protective film 908 is formed of stacked layers of the aluminum oxide film formed by a sputtering method and the aluminum oxide film formed by an ALD method. From the above, it was found that formation of the protective film of one embodiment of the present invention over a light-emitting element prevents deterioration of the light-emitting element.

<Emission Characteristics>

Figure 25A:
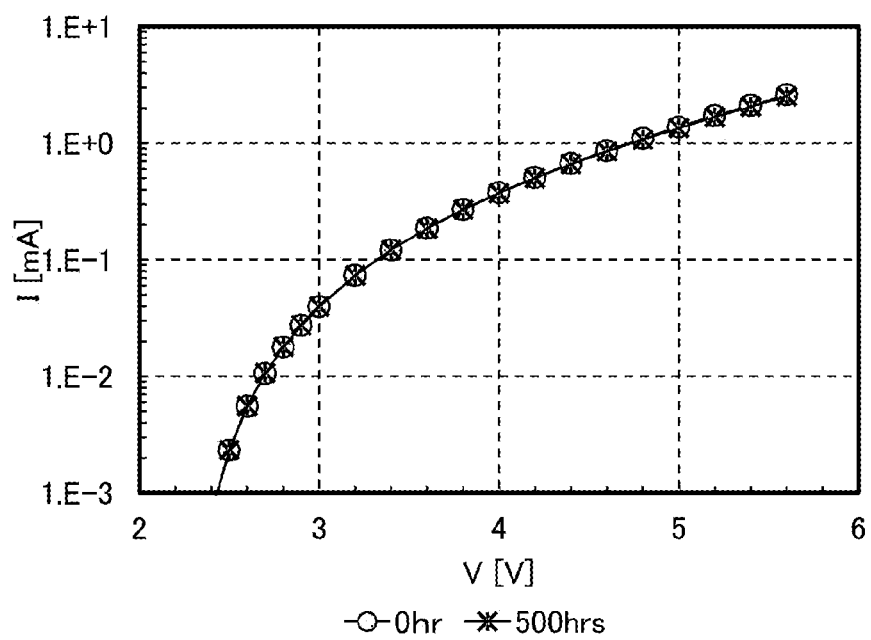
FIGS. 25A and 25B show emission characteristics of a sample.
Figure 25B:
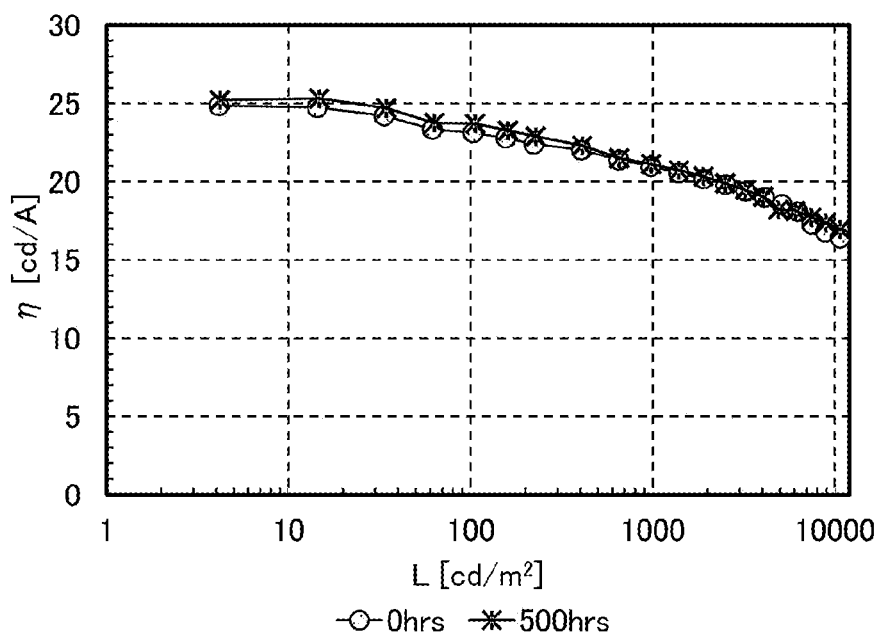
Figure 26A:
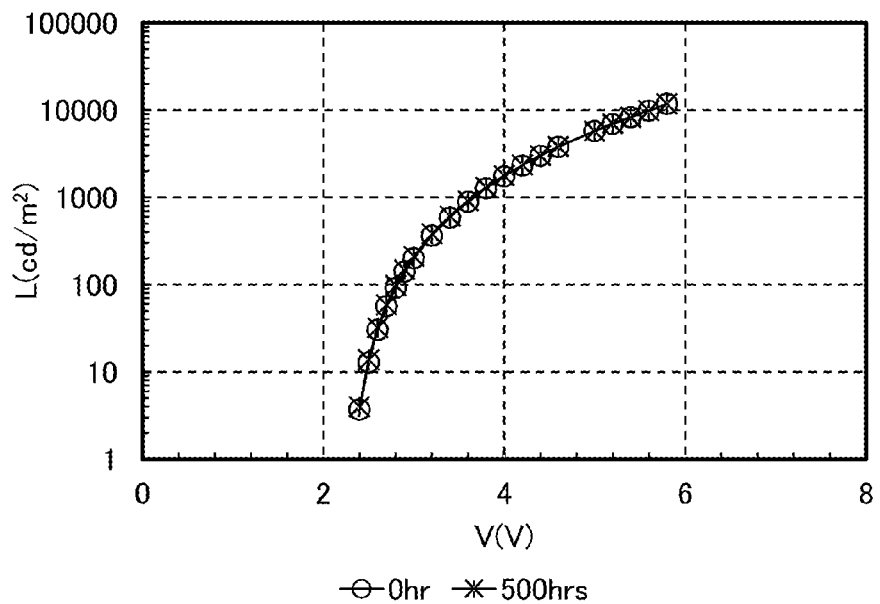
FIGS. 26A and 26B show emission characteristics of a sample.
Figure 26B:
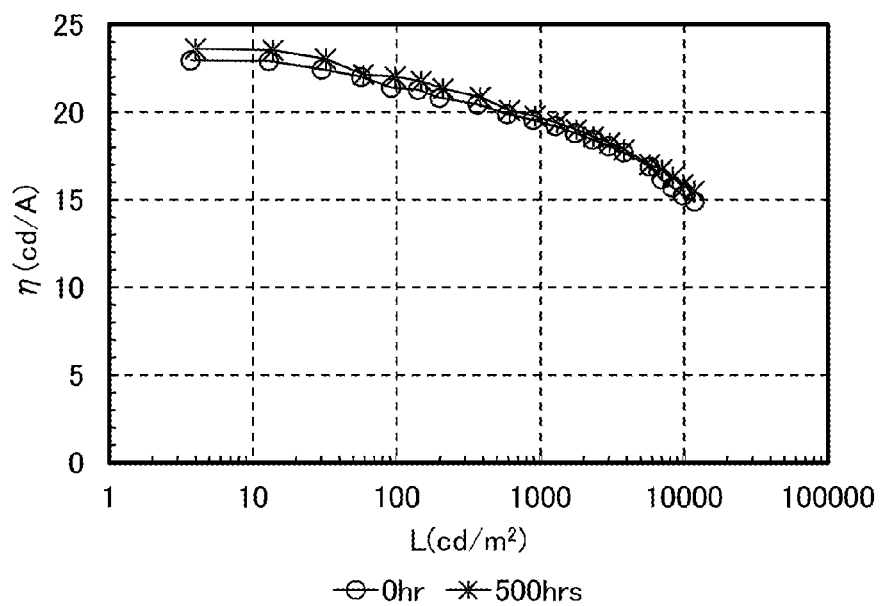

Next, emission characteristics of Samples M21 and M22 were evaluated after the high-temperature high-humidity preservation test. FIGS. 25A and 25B and FIGS. 26A and 26B show emission characteristics of Sample M21 and Sample M22, respectively. FIGS. 25A and 26A each show voltage-current characteristics of the light-emitting element before and after the preservation test, FIGS. 25B and 26B each show luminance-current efficiency characteristics of the light-emitting element before and after the preservation test.

From FIGS. 25A and 25B and FIGS. 26A and 26B, it can be seen that even after the preservation test (500 hours), optical characteristics did not change from the initial state (0 hours). In other words, the protective films included in Samples M21 and M22 reduced moisture diffusion from the outside to the light-emitting element and prevented deterioration of the light-emitting element.

This application is based on Japanese Patent Application Serial No. 2016-157108 filed with Japan Patent Office on Aug. 10, 2016 and Japanese Patent Application Serial No. 2017-003831 filed with Japan Patent Office on Jan. 13, 2017, the entire contents of which are hereby incorporated by reference.

What is claimed is:

1. A display device comprising:
   a first electrode;
   a second electrode;
   a light-emitting layer between the first electrode and the second electrode; and
   a protective film over the second electrode,
   wherein the protective film comprises a first insulating film and a second insulating film over the first insulating film,
   wherein the first insulating film comprises one or more of aluminum oxide, hafnium oxide, and zirconium oxide,
   wherein the second insulating film comprises one or more of aluminum oxide, hafnium oxide, and zirconium oxide, and
   wherein a water vapor transmission rate of the protective film is lower than $1\times10^{-2}$ g/(m²·day) under a condition of 40° C. and a relative humidity of 90%.

2. The display device according to claim 1,
   wherein a composition of the first insulating film is different from a composition of the second insulating film.

3. The display device according to claim 1,
   wherein the second insulating film has a higher carbon content than the first insulating film.

4. The display device according to claim 1, further comprising a color film in contact with the second insulating film.

5. The display device according to claim 1, further comprising a first display element,
   wherein the first display element is a light-emitting element comprising the first electrode, the second electrode, and the light-emitting layer between the first electrode and the second electrode.

6. The display device according to claim 1,
   wherein the second insulating film is formed by an atomic layer deposition method.

7. A display device comprising:
   a first electrode;
   a third insulating film overlapping with an edge portion of the first electrode;
   a light-emitting layer over the first electrode and the third insulating film;
   a second electrode over the light-emitting layer; and
   a protective film over the second electrode,
   wherein the protective film comprises a first insulating film and a second insulating film over the first insulating film,
   wherein the first insulating film comprises one or more of aluminum oxide, hafnium oxide, and zirconium oxide,
   wherein the second insulating film comprises one or more of aluminum oxide, hafnium oxide, and zirconium oxide,
   wherein the first insulating film comprises a first region overlapping with the first electrode with the light-emitting layer positioned therebetween and a second region overlapping with the third insulating film with the light-emitting layer positioned therebetween,
   wherein the second region comprises a region having a lower film density than the first region, and
   wherein a water vapor transmission rate of the protective film is lower than $1\times10^{-2}$ g/(m²·day) under a condition of 40° C. and a relative humidity of 90%.

8. The display device according to claim 7, wherein part of the second insulating film fills part of the first insulating film.

9. The display device according to claim 7, wherein a composition of the first insulating film is different from a composition of the second insulating film.

10. The display device according to claim 7, wherein the second insulating film has a higher carbon content than the first insulating film.

11. The display device according to claim 7, further comprising a color film in contact with the second insulating film.

12. The display device according to claim 7, further comprising a first display element, wherein the first display element is a light-emitting element comprising the first electrode, the second electrode, and the light-emitting layer between the first electrode and the second electrode.

13. The display device according to claim 7, further comprising a first display element and a second display element, wherein the first display element is a light-emitting element comprising the first electrode, the second electrode, and the light-emitting layer between the first electrode and the second electrode, and wherein the second display element is a liquid crystal element.

14. The display device according to claim 7, wherein the second insulating film is formed by an atomic layer deposition method.

15. A method for manufacturing a display device, comprising the steps of:
    forming a light-emitting element comprising a light-emitting layer;
    forming a first insulating film comprising one or more of aluminum oxide, hafnium oxide, and zirconium oxide over the light-emitting element by a sputtering method; and
    forming the second insulating film comprising one or more of aluminum oxide, hafnium oxide, and zirconium oxide over the first insulating film by an atomic layer deposition method.

16. The method for manufacturing a display device according to claim 15, further comprising a step of forming a color film over the second insulating film.

* * * * *